(12) United States Patent
Lee et al.

(10) Patent No.: US 11,615,752 B2
(45) Date of Patent: Mar. 28, 2023

(54) BACKLIGHT DRIVER, BACKLIGHT DEVICE INCLUDING THE SAME, AND OPERATING METHOD OF THE BACKLIGHT DEVICE

(71) Applicant: SAMSUNG ELECTRONICS CO., LTD., Suwon-si (KR)

(72) Inventors: Changju Lee, Suwon-si (KR); Yongil Kwon, Suwon-si (KR); Yoon-Kyung Choi, Seongnam-si (KR); Junho Huh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 17/244,369

(22) Filed: Apr. 29, 2021

(65) Prior Publication Data
US 2021/0350754 A1  Nov. 11, 2021

(30) Foreign Application Priority Data

May 7, 2020  (KR) .................. 10-2020-0054762
Jan. 13, 2021 (KR) .................. 10-2021-0004923

(51) Int. Cl.
*G09G 3/32* (2016.01)
*G09G 3/34* (2006.01)
*G09G 5/10* (2006.01)

(52) U.S. Cl.
CPC ............ *G09G 3/3426* (2013.01); *G09G 3/32* (2013.01); *G09G 5/10* (2013.01); *G09G 2320/064* (2013.01)

(58) Field of Classification Search
CPC .......... G09G 3/3426; G09G 3/32; G09G 5/10; G09G 2320/064; G09G 3/2085;
(Continued)

(56) References Cited

U.S. PATENT DOCUMENTS 6,954,166 B2  10/2005  Kasi
7,233,322 B2   6/2007  Takehara et al.
(Continued)

FOREIGN PATENT DOCUMENTS

JP  2004-145027 A  5/2004
JP  2005-107076 A  4/2005
(Continued)

OTHER PUBLICATIONS

Razavi, Behzad, "Principles of Data Conversion System Design", IEEE Wiley-Interscience, 1995, Chapter 2~Chapter 3. (136 pages total).
(Continued)

*Primary Examiner* — Antonio Xavier
(74) *Attorney, Agent, or Firm* — Sughrue Mion, PLLC

(57) ABSTRACT

A backlight device includes LED elements divided into dimming groups; a panel driver configured to output a reference current for driving the LED elements; and pixel circuits, each of which is connected to the panel driver through a common line and is respectively configured to drive first LED elements comprised in a corresponding dimming group. Each of the pixel circuits is configured to: in a first period of a frame period, obtain a reference voltage based on the reference current and store the reference voltage, in a second period of the frame period, obtain luminance data of an image displayed by the corresponding dimming group, and in a third period of the frame period, drive the first LED elements during a light emitting time corresponding to the luminance data obtained in the second period using the reference voltage stored in the first period.

20 Claims, 25 Drawing Sheets

(58) Field of Classification Search
CPC ......... G09G 3/3406; G09G 2320/0646; G09G 2320/062; H01L 25/0753; H01L 25/167
See application file for complete search history.

(56) References Cited

U.S. PATENT DOCUMENTS

| | | |
|---|---|---|
| 7,239,087 B2 | 7/2007 | Ball |
| 7,626,565 B2 | 12/2009 | Tsuge |
| 7,652,650 B2 | 1/2010 | Takagi et al. |
| 9,893,736 B2 | 2/2018 | Sato et al. |
| 10,762,836 B1 * | 9/2020 | Bae ................... G09G 3/3233 |
| 2007/0278965 A1 * | 12/2007 | Maede ................ G09G 3/3283 315/169.3 |
| 2015/0187276 A1 * | 7/2015 | Shim ................... G09G 3/3291 345/77 |
| 2016/0284283 A1 * | 9/2016 | Kurita ................. G09G 3/2081 |
| 2019/0053337 A1 * | 2/2019 | Xie ....................... H05B 45/46 |
| 2020/0275537 A1 * | 8/2020 | Takahashi .......... H05B 45/3725 |
| 2021/0144822 A1 * | 5/2021 | Zha .................... H05B 45/3725 |

FOREIGN PATENT DOCUMENTS

| | | |
|---|---|---|
| JP | 2006-106664 A | 4/2006 |
| JP | 4273718 B2 | 6/2009 |
| KR | 10-1177907 B1 | 8/2012 |

OTHER PUBLICATIONS

Shu, Xiao et al., "Optical local dimming for LC image formation with controllable backlighting", IEEE Transaction on Image Processing, Jan. 2013, vol. 22, No. 1. (9 pages total).

* cited by examiner

BACKLIGHT DRIVER, BACKLIGHT DEVICE INCLUDING THE SAME, AND OPERATING METHOD OF THE BACKLIGHT DEVICE

CROSS-REFERENCE TO THE RELATED APPLICATIONS

This application claims priority from Korean Patent Application No. 10-2020-0054762, filed on May 7, 2020 in the Korean Intellectual Property Office, and Korean Patent Application No. 10-2021-0004923, filed on Jan. 13, 2021 in the Korean Intellectual Property Office, the disclosures of which are incorporated herein by reference in their entireties.

BACKGROUND

Methods, apparatuses and systems consistent with example embodiments relate to a backlight driver, a backlight device including the same and an operating method of the backlight device, and more particularly, to a backlight driver for driving light emitting diode (LED) elements using a plurality of pixel circuits sharing one current source, a backlight device including the same, and an operating method of the backlight device.

Display devices are widely used in smartphones, notebook computers, and monitors, and may include a display panel that displays an image. In this regard, when the display panel is a liquid crystal display (LCD) panel rather than an organic light emitting diode (OLED) panel including an element that emits light by itself, a backlight device for improving a contrast ratio may be provided. The backlight device may include a plurality of light emitting diode (LED) elements, and may be disposed on the rear surface of the display panel.

Recently, local dimming that drives the plurality of LED elements for each region of the display panel has been widely applied to the backlight device. In particular, full array local dimming (FALD), in which LED elements are arranged in a 2D array over the entire region of the display panel, has been attracting great attention. Because FALD requires a large number of LED elements, a considerable number of pixel circuits for driving the LED elements is also required. However, as the number of pixel circuits increases, a chip-to-chip uniformity may deteriorate, and manufacturing costs may increase due to an increase in components.

SUMMARY

Example embodiments provide a backlight driver that stores a reference current in a plurality of pixel circuits sharing one current source in a time division method and performs a local dimming operation based on the stored reference current, a backlight device including the same, and an operating method of the backlight device.

According to an aspect of an example embodiment, a backlight device includes a plurality of light emitting diode (LED) elements divided into a plurality of dimming groups; a panel driver configured to output a reference current for driving the plurality of LED elements; and a plurality of pixel circuits, each of which is connected to the panel driver through a common line and is respectively configured to drive first LED elements comprised in a corresponding dimming group among the plurality of dimming groups. Each of the plurality of pixel circuits is configured to: in a first period of a frame period, obtain a reference voltage based on the reference current and store the reference voltage, in a second period of the frame period, obtain luminance data of an image displayed by the corresponding dimming group, and in a third period of the frame period, drive the first LED elements during a light emitting time corresponding to the luminance data obtained in the second period using the reference voltage stored in the first period.

According to an aspect of an example embodiment, a backlight driver is provided. The backlight driver is configured to operate in units of a frame period comprising a charging period and a display period, and the backlight driver includes: a first pixel circuit configured to drive first light emitting diode (LED) elements corresponding to a first region of a display panel; a second pixel circuit configured to drive second LED elements corresponding to a second region of the display panel; and a panel driver comprising a current source connected in parallel with the first pixel circuit and the second pixel circuit, and configured to provide a reference current to the first pixel circuit and the second pixel circuit based on the current source. The first pixel circuit is configured to: in a first sampling period of the charging period, obtain a reference voltage based on the reference current and store the reference voltage, and in the display period, drive the first LED elements based on first luminance data representing a luminance corresponding to the first region. The second pixel circuit is configured to: in a second sampling period of the charging period, obtain the reference voltage based on the reference current and store the reference voltage, and in the display period, drive the second LED elements based on second luminance data representing a luminance corresponding to the second region.

According to an aspect of an example embodiment, a method of driving a backlight device for providing illumination to a display panel includes: generating a reference current using a current source in a first period of a frame period; in the first period, obtaining a reference voltage based on the reference current in a time division method using N (N is a positive integer) pixel circuits sharing the current source, and storing the reference voltage in each of the N pixel circuits; in a second period of the frame period, obtaining N luminance data respectively corresponding to N regions of an image displayed on the display panel; and in a third period of the frame period, driving LED elements during a light emitting time corresponding to the N luminance data using the reference voltage stored in the N pixel circuits.

According to an aspect of an example embodiment, a backlight driver includes: a first pixel circuit configured to drive first light emitting diode (LED) elements corresponding to a first region of a display panel; a second pixel circuit configured to drive second LED elements corresponding to a second region of the display panel; and a panel driver comprising a current source connected in parallel with the first pixel circuit and the second pixel circuit, and configured to provide a reference current to the first pixel circuit and the second pixel circuit based on the current source. The first pixel circuit is configured to obtain a reference voltage based on the reference current, store the reference voltage according to a first writing signal provided from the panel driver, and drive the first LED elements based on first luminance data representing a luminance corresponding to the first region, and the second pixel circuit is configured to obtain the reference voltage based on the reference current, store the reference voltage according to a second writing signal provided from the panel driver, and drive the second LED elements based on second luminance data representing a luminance corresponding to the second region.

BRIEF DESCRIPTION OF THE DRAWINGS

Example embodiments will be more clearly understood from the following detailed description taken in conjunction with the accompanying drawings in which.

DETAILED DESCRIPTION

Figure 1:
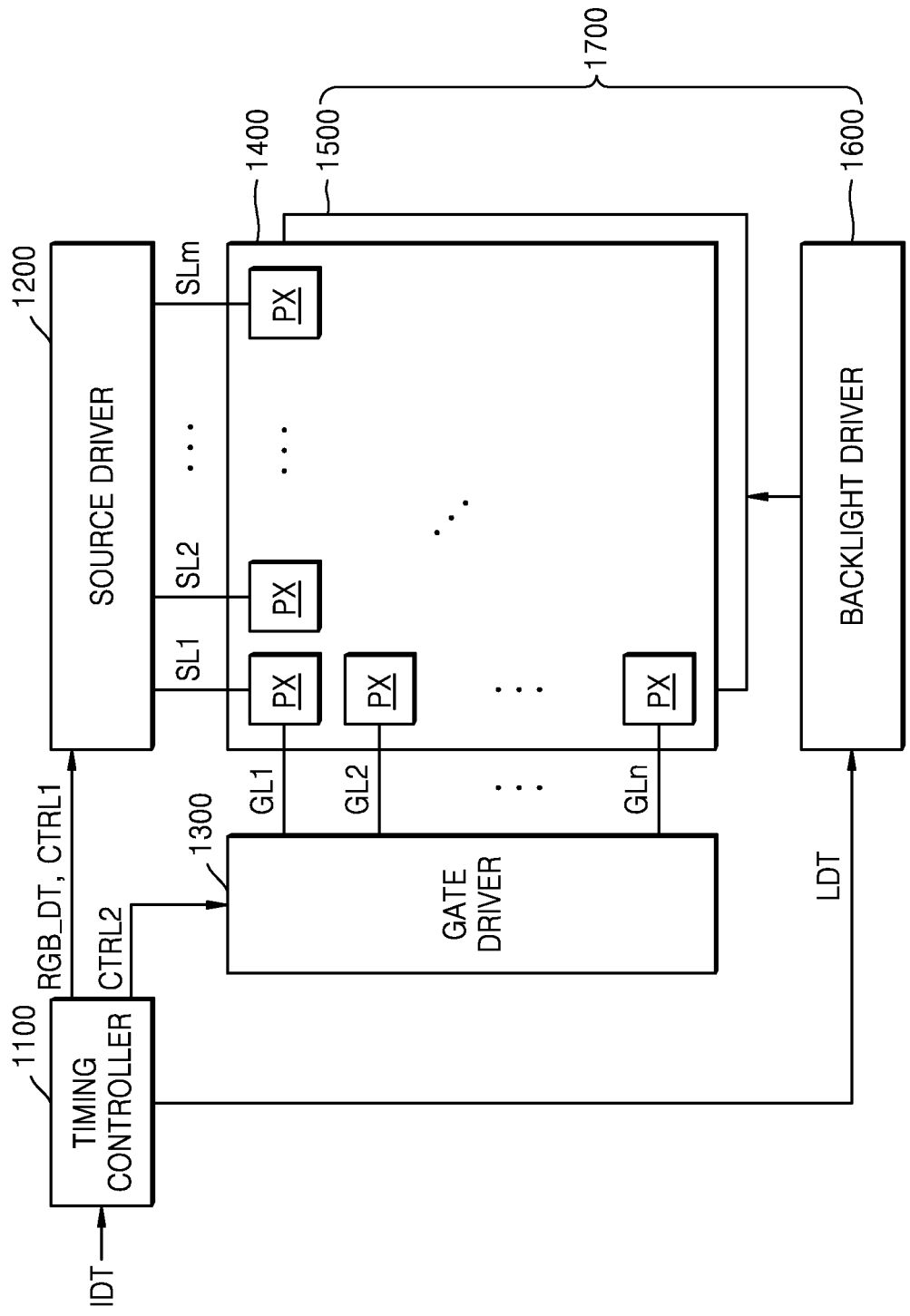
FIG. 1 is a block diagram illustrating a display device according to an example embodiment.

FIG. 1 is a block diagram illustrating a display device 1000 according to an example embodiment.

Referring to FIG. 1, the display device 1000 may include a timing controller 1100, a source driver 1200, a gate driver 1300, a display panel 1400, a backlight unit 1500, and a backlight driver 1600. In some example embodiments, a configuration including the timing controller 1100, the source driver 1200, the gate driver 1300, and the backlight driver 1600 may be referred to as a display driver. In some example embodiments, a configuration including the backlight unit 1500 and the backlight driver 1600 may be referred to as a backlight device 1700. In some example embodiments, the display device 1000 may further include components such as a voltage generator that generates various voltages required for driving the display device 1000, and a memory that stores data.

The display device 1000 may be mounted on an electronic device having an image display function. For example, the electronic device may include a smartphone, a tablet personal computer (PC), a portable multimedia player (PMP), a camera, a wearable device, a television, a digital video disk (DVD) player, a refrigerator, an air conditioner, an air purifier, a set-top box, a robot, a drone, various medical devices, a navigation device, a global positioning system receiver, a vehicle device, furniture, or various measuring devices.

The timing controller 1100 may control the overall operation of the display device 1000. For example, the timing controller 1100 may control the source driver 1200 and the gate driver 1300 so that image data IDT received from an external device is displayed on the display panel 1400.

Specifically, the timing controller 1100 may generate pixel data RGB_DT in a format corresponding to an interface specification with the source driver 1200 based on the image data IDT received from the outside, and may output the pixel data RGB_DT to the source driver 1200. For example, the pixel data RGB_DT may include a red RED component, a blue BLUE component, and a green GREEN component of each of pixels constituting an image. In addition, the timing controller 1100 may generate various control signals CTRL1 and CTRL2 for respectively controlling timing of the source driver 1200 and the gate driver 1300. The timing controller 1100 may output the first control signal CTRL1 to the source driver 1200 and the second control signal CTRL2 to the gate driver 1300.

In addition, the timing controller 1100 may generate luminance data LDT indicating luminance of an image based on the image data IDT, and output the generated luminance data LDT to the backlight driver 1600. The luminance data LDT may be generated for each frame. In some example embodiments, the timing controller 1100 may reflect the generated luminance data LDT to the pixel data RGB_DT.

The source driver 1200 may convert the pixel data RGB_DT received from the timing controller 1100 into a plurality of image signals, for example, a plurality of data voltages, and output the plurality of data voltages to the display panel 1400 through the plurality of source lines SL1 to SLm. The gate driver 1300 may be connected to a plurality of gate lines GL1 to GLn of the display panel 1400 and may sequentially drive the plurality of gate lines GL1 to GLn of the display panel 1400.

The display panel 1400 is a display on which an actual image is displayed, and may be a display device that receives an electrically transmitted image signal and displays a 2D image such as an organic light emitting diode (OLED) display, a thin film transistor-liquid crystal display (TFT-LCD), a field emission display, a plasma display panel (PDP), etc. However, example embodiments are not limited thereto, and the display panel 1400 may be implemented as another type of a flat panel display or a flexible display panel. Hereinafter, the display panel 1400 will be described as a TFT-LCD implemented as an element that does not emit light by itself.

The display panel 1400 may include the plurality of gate lines GL1 to GLn, a plurality of source lines SL1 to SLm disposed in a direction intersecting with the plurality of gate lines GL1 to GLn, and a plurality of pixels PX arranged in a region where the plurality of gate lines GL1 to GLn and the plurality of source lines SL1 to SLm intersect.

The backlight unit 1500 may be disposed on a rear surface of the display panel 1400 to provide additional lighting to improve a contrast ratio of the display panel 1400. To this end, the backlight unit 1500 may include a plurality of light emitting diode (LED) elements that emit light under control of the backlight driver 1600. The plurality of LED elements may be divided into a plurality of dimming groups corresponding to a plurality of regions of the display panel 1400, and the number of LED elements included in the plurality of dimming groups may be the same or different, respectively. Each of the plurality of LED elements may be implemented as a blue LED element or a white LED element, but example embodiments are not limited thereto, and each of the plurality of LED elements may be implemented as various LED elements such as a red LED element and a green LED element.

The backlight driver 1600 may drive the plurality of LED elements of the backlight unit 1500 by using a local dimming method. Specifically, the backlight driver 1600 may control a plurality of LED elements so that a plurality of dimming groups of the backlight unit 1500 emit light at individual luminances. In some example embodiments, the backlight driver 1600 may control the plurality of LED elements so that the plurality of dimming groups emit light at the individual luminances using the luminance data LDT received from the timing controller 1100.

Figure 2:
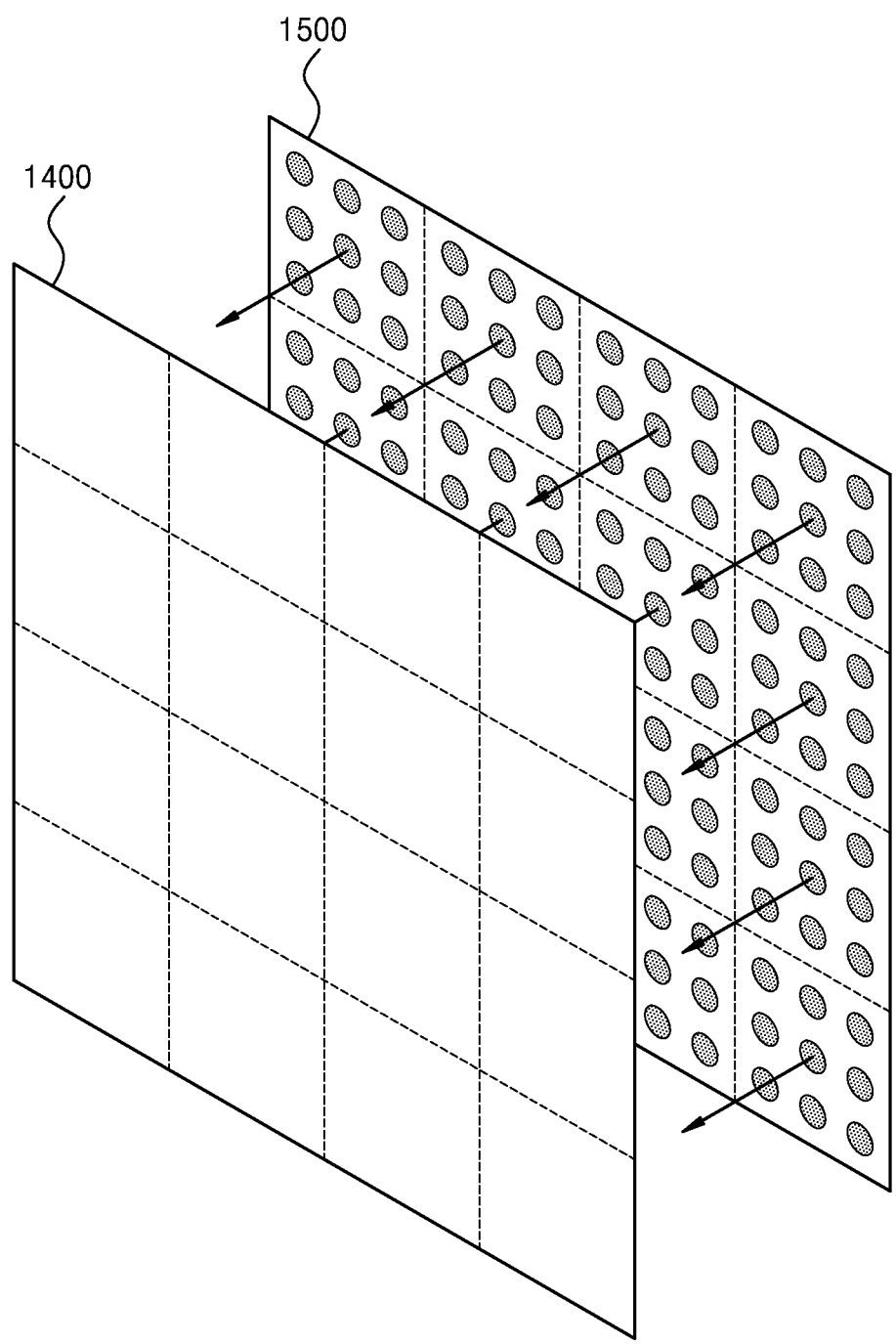
FIG. 2 is a diagram illustrating a display panel and a backlight unit according to an example embodiment.

FIG. 2 is a diagram illustrating the display panel 1400 and the backlight unit 1500 according to an example embodiment. In detail, FIG. 2 is a diagram illustrating the display panel 1400 and the backlight unit 1500 of FIG. 1.

The display panel 1400 may be divided into a plurality of regions of arranged in m rows and n columns, i.e., an m×n arrangement (m and n are positive integers), and the backlight unit 1500 may also be divided into a plurality of dimming groups of the m×n arrangement corresponding to the plurality of regions, respectively. For example, referring to FIG. 2, the display panel 1400 may be divided into a plurality of regions of a 4×4 arrangement, and the backlight unit 1500 may be divided into a plurality of dimming groups of the 4×4 arrangement. In other words, the display panel 1400 may be divided into a first through sixteenth regions, and the backlight unit 1500 may be divided into a first through sixteenth dimming groups corresponding to the first to sixteenth regions, respectively. The m×n arrangement of the plurality of dimming groups is not limited to the above-described example, and various m×n arrangements may be applied.

The backlight driver 1600 may confirm a luminance of an image displayed on each of the plurality of regions of the display panel 1400 based on the received luminance data LDT. In addition, the backlight driver 1600 may drive the backlight unit 1500 for each dimming group to emit light at a brightness corresponding to the luminance of the plurality of regions. The luminance data LDT may include a plurality of levels indicating a degree of luminance of an image.

For example, the backlight driver 1600 may determine a luminance of an image displayed on the first region of the display panel 1400 based on the luminance data LDT, and may control LED elements included in the first dimming group of the display panel 1400 to emit light at a brightness corresponding to the determined luminance. A detailed description of a method of driving the backlight unit 1500 based on the luminance data LDT of the backlight driver 1600 will be described later with reference to FIG. 5.

In FIGS. 1 and 2, it is described that the backlight driver 1600 receives the luminance data LDT and drives the backlight unit 1500 using the received luminance data LDT, but example embodiments are not limited to thereto. For example, the backlight driver 1600 may be implemented to receive the image data IDT or the pixel data RGB_DT from the timing controller 1100, calculate luminance of the plurality of regions of the display panel 1400 using the received image data IDT or pixel data RGB_DT and drive the backlight unit 1500 based on the calculated luminance.

Figure 3:
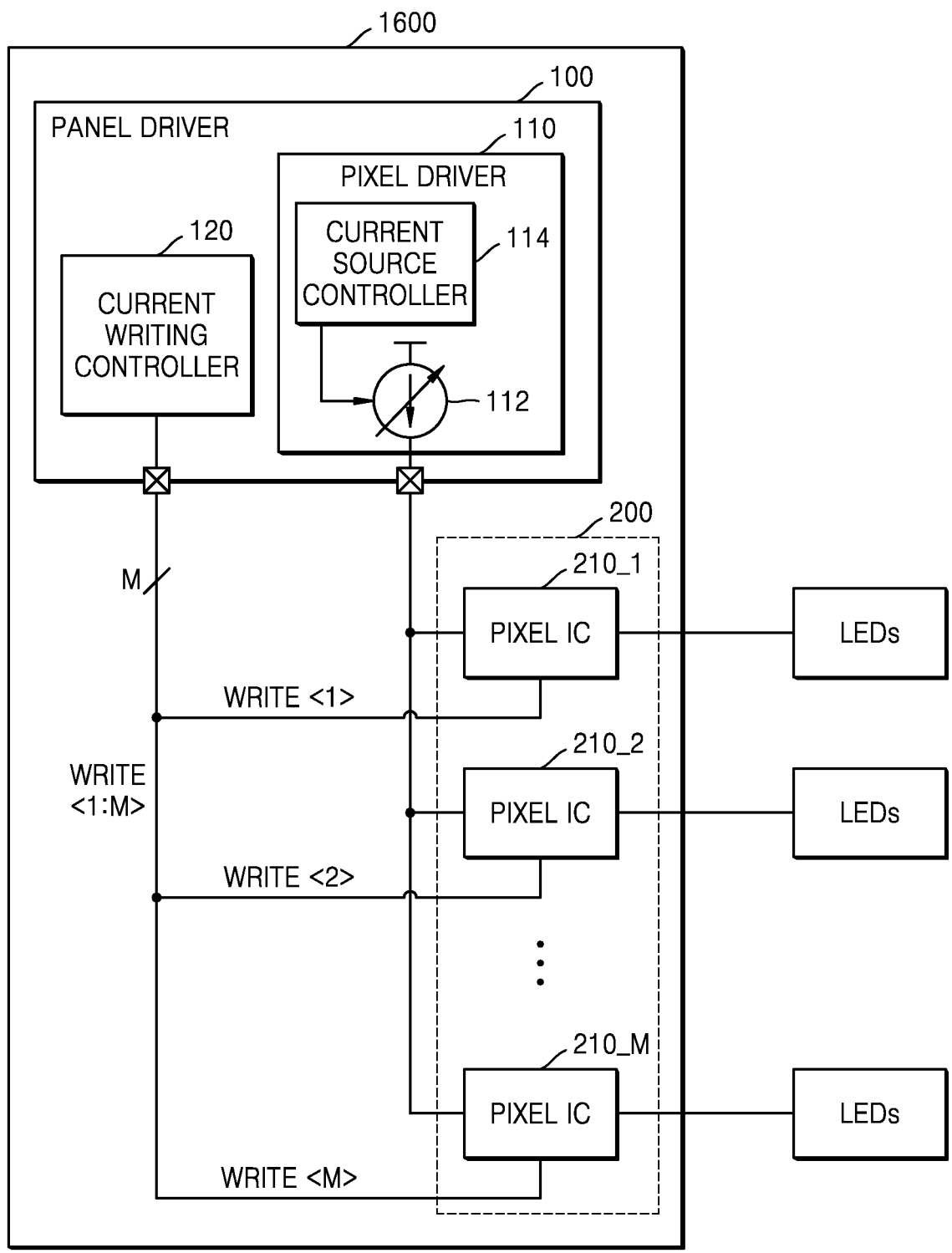
FIG. 3 is a block diagram illustrating a backlight driver according to an example embodiment.

FIG. 3 is a block diagram illustrating the backlight driver 1600 according to an example embodiment. In detail, FIG. 3 is a diagram illustrating the backlight driver 1600 of FIG. 1.

Referring to FIG. 3, the backlight driver 1600 may include a panel driver 100 providing power and a pixel circuit group 200 driving a plurality of LED elements of the backlight unit 1500 based on the provided power. The pixel circuit group 200 may include M (M is a positive integer) pixel circuits 210_1, 210_2, . . . and, 210_M. Each of the pixel circuits 210_1, 210_2, . . . and, 210_M may drive LED elements included in at least one of a plurality of dimming groups of the backlight unit 1500, or some of LED elements included in any one dimming group. That is, each of the pixel circuits 210_1, 210_2, . . . and, 210_M may correspond to at least some of the plurality of regions of the display panel 1400. The number of LED elements driven by the pixel circuits 210_1, 210_2, . . . and, 210_M may be the same or different, respectively.

The panel driver 100 and the pixel circuit group 200 may repeatedly perform a current storage operation for driving the LED elements, a storage operation of luminance data LDT corresponding to the brightness of the LED elements to be driven, and a driving operation of the LED elements for each frame period, which is a time allocated to each frame. Hereinafter, the above operations performed within a frame period will be described in detail.

The panel driver 100 may provide a reference current to the pixel circuit group 200 by using a time division method. Specifically, the panel driver 100 may provide the reference current to the pixel circuit group 200 only in a first period of the frame period. In addition, the panel driver 100 may include a pixel driver 110 and a current writing (CW) controller 120. The pixel driver 110 may include a current source 112 and a current source controller 114, and the current source controller 114 may control the current source 112 to provide the reference current in the first period. In example embodiments, the current source controller 114 may control a magnitude of the reference current or control a duty ratio of the reference current. A detailed description of this will be given later with reference to FIGS. 8A and 8B.

Because the pixel driver 110 is connected in parallel to the pixel circuits 210_1, 210_2, . . . and 210_M through a common line, the reference current provided from the current source 112 may be provided in parallel in the pixel circuits 210_1, 210_2, . . . and 210_M. That is, the pixel circuits 210_1, 210_2, . . . and 210_M may share the current source 112. Further, the pixel circuits 210_1, 210_2, . . . and 210_M may copy and store the provided reference current. Hereinafter, for convenience of description, an operation of providing the reference current and copying and storing the provided reference current is referred to as a CW operation. The name of the operation is not limited to the above-described example, and may be referred to as a charging operation.

The CW controller 120 may output a writing signal WRITE<1:M> indicating a performing time of the CW operation in response to the provision of the reference current. The writing signal WRITE<1:M> may be provided through M lines connecting the CW controller 120 and each of the pixel circuits 210_1, 210_2, . . . and 210_M. For example, a writing signal WRITE<1> may be provided to the first pixel circuit 210_1 through a first line, a writing signal WRITE<2> may be provided through a second line to the second pixel circuit 210_2 and a writing signal WRITE<M> may be provided to the Mth pixel circuit 210_M through an Mth line. The pixel circuits 210_1, 210_2, . . . and 210_M may copy and store the reference current according to the writing signal WRITE<1:M>, and drive the LED elements based on the stored reference current.

Because the pixel driver 110 is connected in parallel with the pixel circuits 210_1, 210_2, . . . and 210_M, when the pixel circuits 210_1, 210_2, . . . and 210_M simultaneously copy a current, a magnitude of current reaching each of the pixel circuits 210_1, 210_2, . . . and 210_M may decrease to 1/M, so that a magnitude of the copied current may be insufficient. Accordingly, the CW controller 120 may generate the writing signal WRITE<1:M> so that the performing times of the CW operations of the pixel circuits 210_1, 210_2, . . . and 210_M are different from each other. For example, the CW controller 120 may generate the writing signal WRITE<1:M> so that the performing time of the CW operation of the second pixel circuit 210_2 is arranged after the performing time of the CW operation of the first pixel circuit 210_1. Because the pixel driver 110 may provide the reference current to the pixel circuits 210_1, 210_2, . . . and 210_M only in the first period, all the performing times of the CW operations of the pixel circuits 210_1, 210_2, . . . and 210_M may be within the first period.

The pixel circuits 210_1, 210_2, . . . and 210_M may perform the CW operation of copying and storing the reference current in the first period of the frame period. In addition, the pixel circuits 210_1, 210_2, . . . and 210_M may store the corresponding luminance data LDT in a second period of the frame period. Here, the luminance data LDT represents a luminance of an image displayed on a partial region of the display panel 1400 corresponding to each of the pixel circuits 210_1, 210_2, . . . and 210_M. For example, the luminance data LDT of the first pixel circuit 210_1 represents a luminance of an image displayed on a partial region (e.g., a first region) of the display panel 1400 corresponding to the first pixel circuit 210_1.

In some example embodiments, the luminance data LDT may be implemented by using a pulse width modulation (PWM) method. That is, the luminance data LDT may be implemented in the form of a pulse having a width corresponding to the luminance of the image. Hereinafter, for convenience of explanation, it is described that the luminance data LDT is implemented by using the PWM method, and an operation of receiving and storing the luminance data LDT from the timing controller 1100, etc. is referred to as an LDR operation.

In addition, the pixel circuits 210_1, 210_2, . . . and 210_M may drive the LED elements in a third period of the frame period using the reference current stored in the first period of the frame period. In this regard, the pixel circuits 210_1, 210_2, . . . and 210_M may drive the LED elements at a brightness corresponding to the stored luminance data LDT. For example, the first pixel circuit 210_1 may drive the LED elements to emit light during a light emitting (LE) time corresponding to the luminance data LDT of the first pixel circuit 210_1. As the luminance of the image displayed on the display panel 1400 increases, additional illumination of the backlight unit 1500 is required. Therefore, as the luminance data LDT exhibits higher luminance, the pixel circuits 210_1, 210_2, and . . . 210_M may drive the LED elements for a longer LE time. Hereinafter, for convenience of description, an operation of driving the LED elements is referred to as an LE operation.

In this way, the backlight driver 1600 may include pixel circuits 210_1, 210_2, . . . and 210_M configured to share the current source 112, and may drive the plurality of LED elements based on one pixel driver, and thus, parts are reduced, which may reduce the size of the backlight driver 1600, and reduce the manufacturing cost. Further, because the backlight driver 1600 provides current only in the first period of the frame period, power consumption may be reduced.

Figure 4:
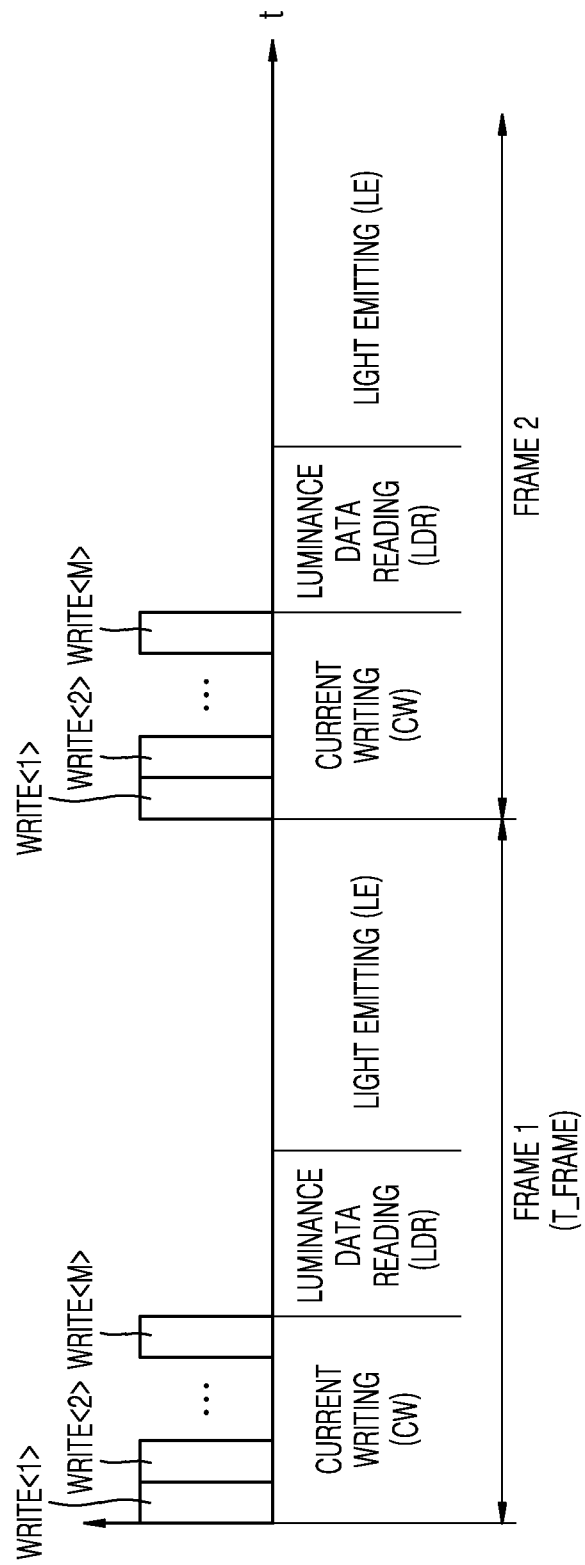
FIG. 4 is a diagram illustrating operations of a backlight driver for each frame period according to an example embodiment.

FIG. 4 is a diagram illustrating operations of the backlight driver 1600 for each frame period according to an example embodiment. In detail, FIG. 4 is a diagram illustrating operations of the backlight driver 1600 of FIG. 3 for each frame period.

Referring to FIG. 4, the backlight driver 1600 may operate in units of a frame period T_FRAME. For example, the backlight driver 1600 may first perform a CW operation in a frame period corresponding to a first frame FRAME 1. In this case, CW operations may be sequentially performed with respect to each of the pixel circuits 210_1, 210_2, . . . and 210_M included in the backlight driver 1600. That is, as shown in FIG. 3, when the backlight driver 1600 includes the M pixel circuits 210_1, 210_2, . . . and 210_M, the backlight driver 1600 may perform the CW operation WRITE<2> of the second pixel circuit 210_2 after performing the CW operation WRITE<1> of the first pixel circuit 210_1. In the above-described manner, the backlight driver 1600 may complete the CW operation WRITE<M> of the Mth pixel circuit 210_M. In this way, a period in which the CW operation is performed may be referred to as a first period. However, example embodiments are not limited thereto, and the first period may be referred to as a charging period or another name.

In addition, when the CW operation is completed, the backlight driver 1600 may perform an LDR operation. That is, each of the M pixel circuits 210_1, 210_2, . . . and 210_M may receive and store the luminance data LDT representing a luminance of an image displayed on a partial region of the display panel 1400 from the timing controller 1100. In this way, a period in which the LDR operation is performed may be referred to as a second period. However, example embodiments are not limited thereto, and the second period may be referred to as a data reading period or another name.

In addition, when the LDR operation is completed, the backlight driver 1600 may perform an LE operation. That is, each of the M pixel circuits 210_1, 210_2, . . . and 210_M may be driven so that LED elements emit light during an LE time corresponding to the luminance data LDT of the backlight unit 1500. A period in which the LE operation is performed may be referred to as a third period. However, example embodiments are not limited thereto, and the third period may be referred to as an LE period or another name.

In some example embodiments, the backlight driver 1600 may repeat the CW operation, the LDR operation, and the LE operation for each frame period. For example, referring to FIG. 4, the backlight driver 1600 may perform the CW operation, the LDR operation, and the LE operation in a frame period with respect to the first frame FRAME 1. In addition, the backlight driver 1600 may perform the CW operation, the LDR operation, and the LE operation in a frame period with respect to the second frame FRAME 2.

Figure 5:
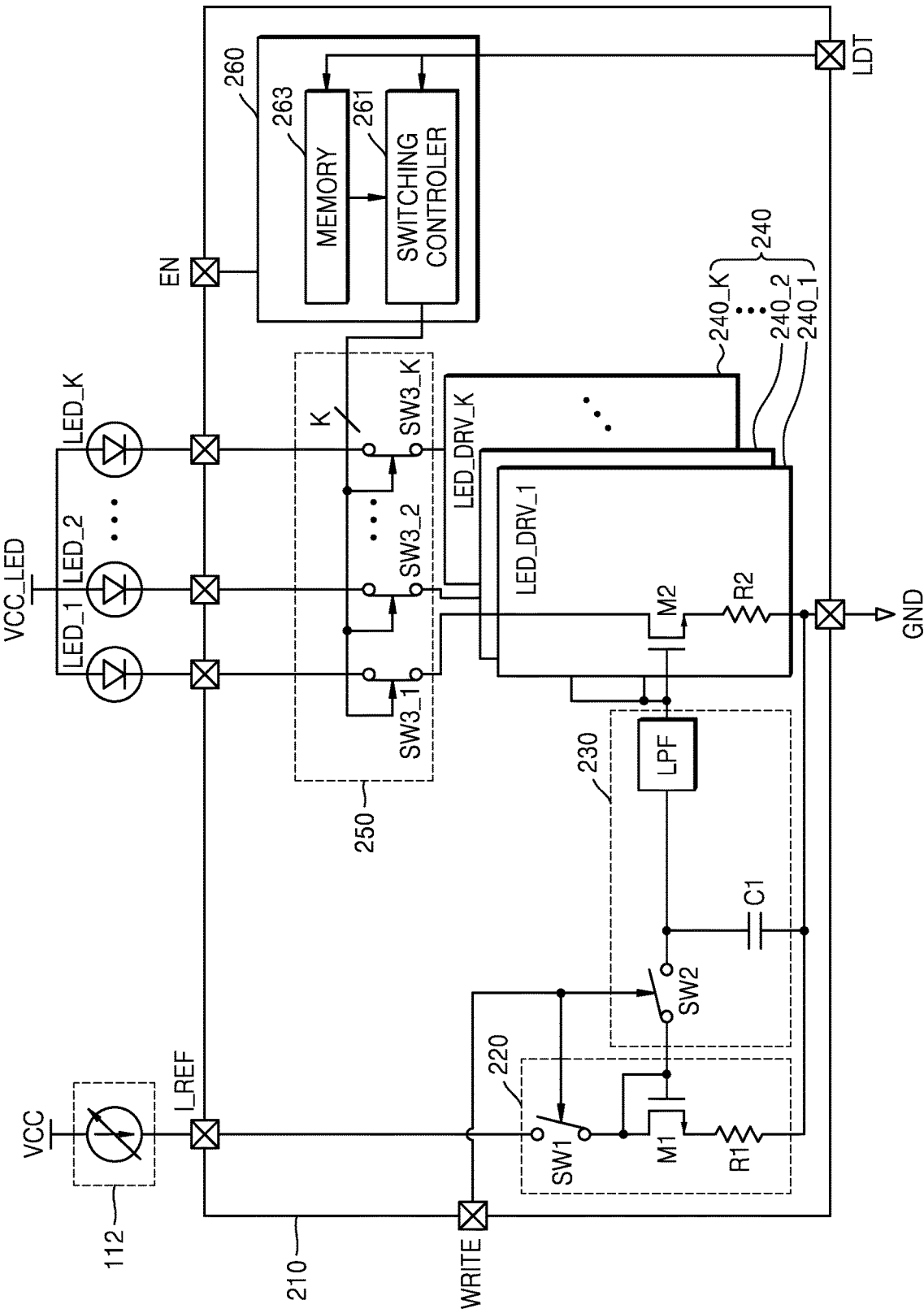
FIG. 5 is a diagram illustrating a pixel circuit according to an example embodiment.

FIG. 5 is a diagram illustrating the pixel circuit 210 according to an example embodiment.

The pixel circuit 210 of FIG. 5 may correspond to any one of the pixel circuits 210_1, 210_2, . . . and 210_M of FIG. 3. Referring to FIG. 5, the pixel circuit 210 may include a current-voltage conversion circuit 220, a sample and hold circuit 230, an LED driver group 240, a switching circuit 250, and a data storage 260. In some example embodiments, the data storage 260 may include a switching controller 261 and a memory 263.

In a first period of a frame period, the current-voltage conversion circuit 220 and the sample-and-hold circuit 230 may perform a CW operation of converting the reference current I_REF into a voltage and storing the converted voltage. In a second period of the frame period, the data storage 260 may perform an LDR operation. In a third period of the frame period, the sample-and-hold circuit 230, the LED driver group 240, the switching circuit 250, and the data storage 260 may perform an LE operation to drive LED elements. Hereinafter, structures and operations of components of the pixel circuit 210 will be described in detail.

The pixel circuit 210 may be connected to the current source 112 of the pixel driver (110 of FIG. 3). The current source 112 may output the reference current I_REF under the control of the current source controller 114. In addition, the reference current I_REF may be input to the current-voltage conversion circuit 220 of the pixel circuit 210. The reference current I_REF may be provided during the first period of the frame period in which the CW operation is performed.

The current-voltage conversion circuit 220 may receive the reference current I_REF from the current source 112 connected to the pixel circuit 210, convert the input reference current I_REF into a voltage, and output the converted voltage to the sample and hold circuit 230. For example, referring to FIG. 5, the current-voltage conversion circuit 220 may include a first transistor M1 having a drain terminal connected to the current source 112 and a gate terminal connected to the drain terminal, and a first resistor R1 having one end connected to a source terminal of the first transistor M1 and the other end that is grounded. The gate terminal of the first transistor M1 may be connected to the sample and hold circuit 230.

In some example embodiments, the current-voltage conversion circuit 220 may receive the writing signal WRITE from the CW controller (120 of FIG. 3), and selectively convert the reference current I_REF into a voltage according to the writing signal WRITE. For example, referring to FIG. 5, the current-voltage conversion circuit 220 may further include a switch SW1 disposed on a line connecting the current source 112 and the first transistor M1 and driven according to the writing signal WRITE. The writing signal WRITE may be implemented as a signal having an active level at a performing time of the CW operation allocated to the pixel circuit 210 in the first period of the frame period. Accordingly, when the writing signal WRITE has the active level, the switch SW1 is closed, so that the reference current I_REF may be input to the current-voltage conversion circuit 220. The performing time of the CW operation allocated to the pixel circuit 210 may be referred to as a sampling period, etc.

The sample and hold circuit 230 may sample and store the voltage converted by the current-voltage conversion circuit 220. For example, referring to FIG. 5, the sample and hold circuit 230 may include a second switch SW2 for sampling a voltage and a first capacitor C1 for holding (i.e., storing) the voltage. Also, the sample and hold circuit 230 may include a low pass filter (LPF) to remove noise. However, example embodiments are not limited thereto, and the LPF may be omitted.

The sample and hold circuit 230 may selectively sample the converted voltage according to the writing signal WRITE received from the CW controller 120. In other words, the sample and hold circuit 230 may sample and store the converted voltage during the performing time of the CW operation allocated to the pixel circuit 210 during the first period of the frame period. For example, referring to FIG. 5, when the writing signal WRITE indicates that the CW operation is to be performed, the second switch SW2 is closed, so that the converted voltage may be sampled. In addition, the sampled voltage may be stored by the first capacitor C1 and may be held when the second switch SW2 is open. In addition, the sample and hold circuit 230 may output a voltage held (i.e., stored) in the third period of the frame period in which the LE operation is performed.

The LED driver group 240 may drive LED elements of the backlight unit 1500 based on the voltage provided from the sample and hold circuit 230. Specifically, the LED driver group 240 may drive the LED elements in the third period of the frame period in which the LE operation is performed. In some example embodiments, the LED driver group 240 may include K (K is a positive integer) LED drivers 240_1, 240_2, . . . and 240_K that respectively drive K LED elements LED_1, LED_2, and LED_K of the backlight unit 1500. The K LED drivers 240_1, 240_2, . . . and 240_K may be connected in parallel with the sample and hold circuit 230. For example, referring to FIG. 5, each of the K LED drivers 240_1, 240_2, and 240_K may include a second transistor M2 having a gate terminal connected to the sample and hold circuit 230 and a drain terminal connected to the LED element and a second resistor R2 having one end connected to a source terminal of the second transistor M2 and the other end that is grounded.

A switching circuit 250 may be disposed between the LED driver group 240 and the K LED elements LED_1, LED_2, and LED_K. In some examples, the switching circuit 250 may include K switches SW3_1, SW3_2, and SW3_K disposed between the K LED drivers 240_1, 240_2, and 240_K and the K LED elements LED_1, LED_2, and LED_K. The K switches SW3_1, SW3_2, and SW3_K of the switching circuit 250 may be opened and closed (i.e., turned on or off) according to the control of the switching controller 261.

The data storage 260 may receive an enable signal EN and selectively perform the LDR operation according to the enable signal EN. The enable signal EN may be implemented as a signal having an active level in the second period of the frame period, and may be generated by the panel driver 100 or the timing controller 1100. When the enable signal EN has the active level, the data storage 260 may perform the LDR operation.

Specifically, the switching controller 261 of the data storage 260 may directly receive the luminance data LDT from the timing controller 1100 in response to the enable signal EN in the second period of the frame period, or may read the luminance data LDT stored in the memory 263. The memory 263 may receive and store the luminance data LDT from the timing controller 1100. In addition, the switching controller 261 may control the switching circuit 250 based on the obtained luminance data LDT in the third period of the frame period in which the LE operation is performed.

In some example embodiments, the switching controller 261 may control the K switches SW3_1, SW3_2, and SW3_K of the switching circuit 250 to close (i.e., operate on) during an LE time corresponding to the luminance data LDT. In some example embodiments, when the luminance data LDT is implemented by using a PWM method, the switching circuit 250 may control the K switches SW3_1, SW3_2, and SW3_K to close during an LE time corresponding to a width of a pulse of the luminance data LDT. For example, the switching circuit 250 may control the K switches SW3_1, SW3_2, and SW3_K to close for a longer LE time as the width of the pulse of the luminance data LDT increases.

In some example embodiments, the switching controller 261 may be implemented in various forms such as a central processing unit (CPU), a processor, a microprocessor, an application processor (AP), a microcontroller unit (MCU), a microcomputer, or a mini computer.

Figure 6A:
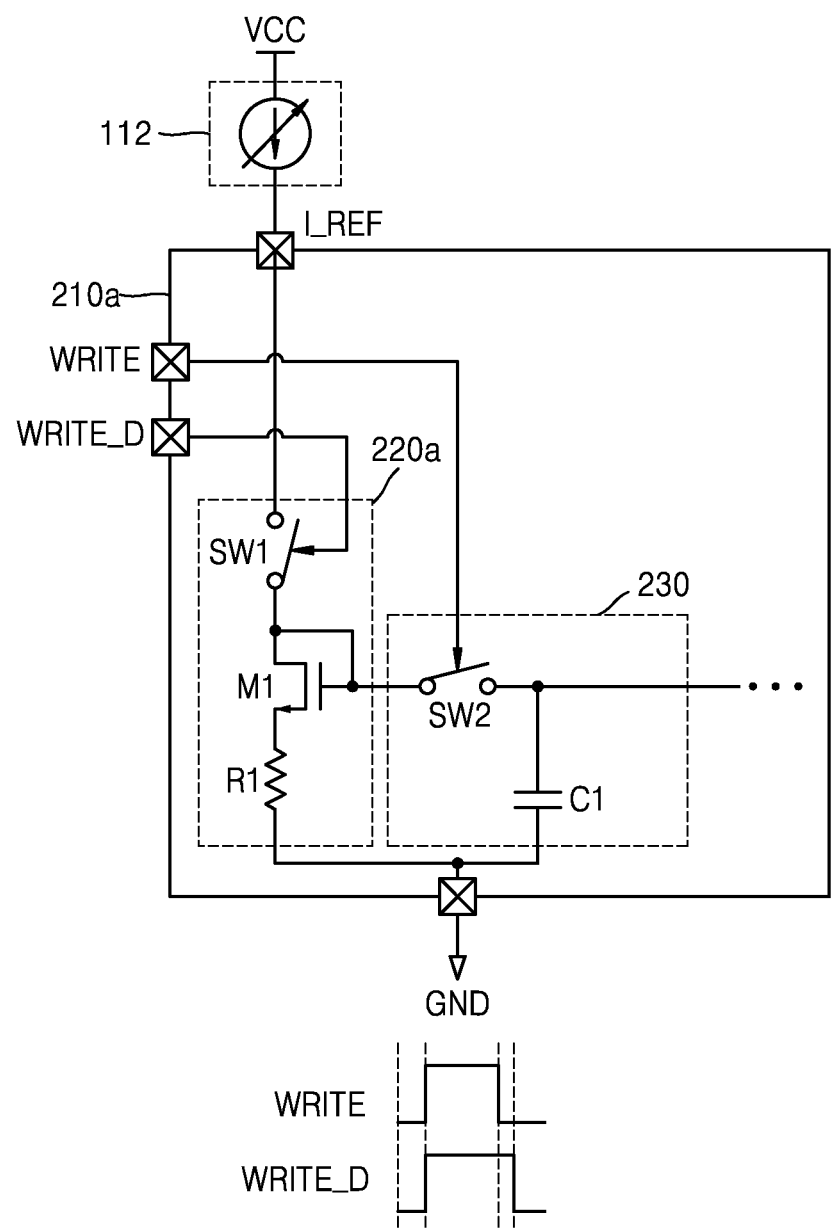
FIGS. 6A and 6B are diagrams illustrating current-voltage conversion circuits according to an example embodiment.
Figure 6B:
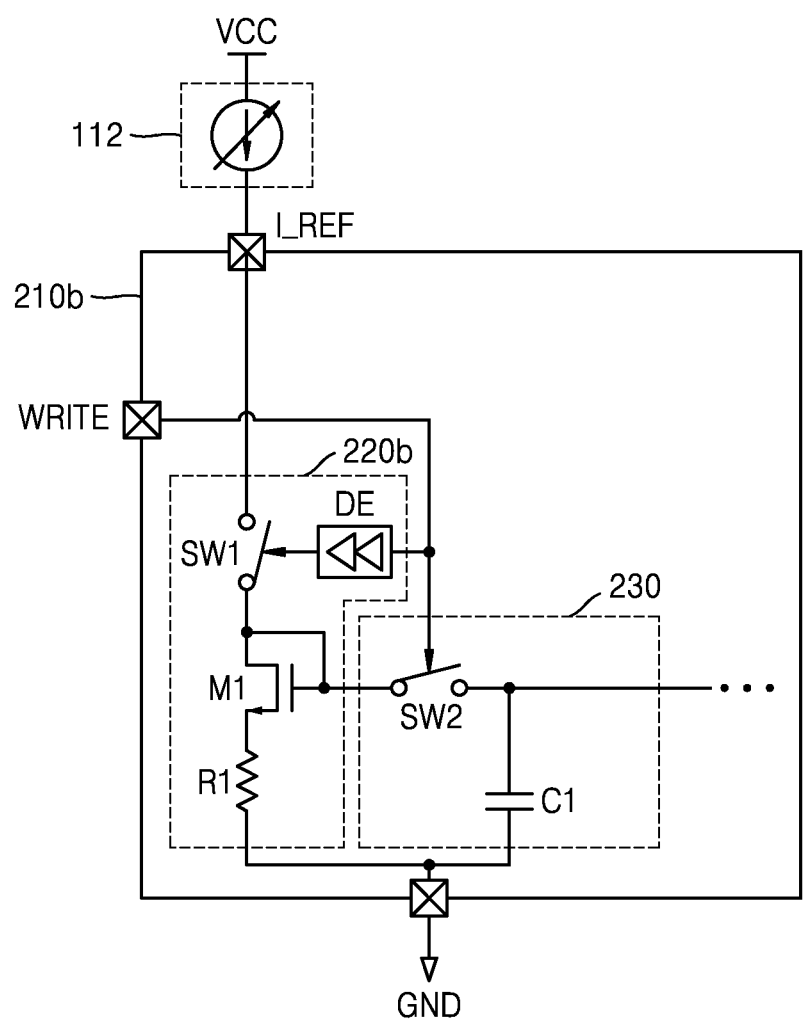

FIGS. 6A and 6B are diagrams illustrating current-voltage conversion circuits 220a and 226b example embodiments. In detail, FIGS. 6A and 6B are diagrams showing examples of the current-voltage conversion circuit 220 of FIG. 5.

The pixel circuit 210 of FIG. 5 may simultaneously control the first switch SW1 of the current-voltage conversion circuit 220 and the second switch SW2 of the sample and hold circuit 230 using one writing signal WRITE. Because the above-described structure may be implemented by simply connecting the first switch SW1 to the second switch SW2, the pixel circuit 210 may correspond to the simplest circuit.

In order to stably sample the reference current I_REF, it may be advantageous that driving timings of the first switch SW1 and the second switch SW2 are different from each other. Specifically, because a supply of the reference current I_REF must be continuously maintained while sampling the voltage converted from the reference current I_REF, a time when the first switch SW1 changes from closed to open may be implemented to be after a time when the second switch SW2 changes from closed to open. Hereinafter, pixel circuits 210a and 210b implemented so that driving timings of the first switch SW1 and the second switch SW2 are different from each other will be described with reference to FIGS. 6A and 6B.

Referring to FIG. 6A, the pixel circuit 210a may receive a first writing signal WRITE and a second writing signal WRITE_D. Here, the first writing signal WRITE is the same signal as the writing signal WRITE of FIG. 5. In addition, the second writing signal WRITE_D has a first level that is an active level at the same time as the first writing signal WRITE, but the first level changes to a second level that is an inactive level at a time later than the first writing signal WRITE.

The first writing signal WRITE is used to control an operation of the second switch SW2 of the sample and hold circuit 230, similar to the example embodiment of FIG. 5. In contrast to the example embodiment of FIG. 5, the current-voltage conversion circuit 220a may operate based on the second writing signal WRITE_D. Accordingly, the first switch SW1 and the second switch SW2 close at the same time, but the first switch SW1 may be opened (i.e., changed to off) after the time when the second switch SW2 is opened.

Referring to FIG. 6A, it is described and illustrated that the second writing signal WRITE_D has an active level at the same time as the first writing signal WRITE, but example embodiments are not limited thereto. For example, the second writing signal WRITE_D may be implemented to have the active level at a later time than the first writing signal WRITE.

Instead of an example embodiment in which the first writing signal WRITE and the second writing signal WRITE_D are individually received, an example embodiment in which the second writing signal WRITE_D is generated using the first writing signal WRITE may also be implemented. Referring to FIG. 6B, the current-voltage conversion circuit 220b may include a delay element DE generating a delay with respect to a signal. For example, the delay element DE may be implemented as an analog element or a digital element such as a shift register, and may be implemented as a combination of the analog element and the digital element according to example embodiments.

The current-voltage conversion circuit 220b may receive the first writing signal WRITE and delay the first writing signal WRITE using the delay element DE to generate the second writing signal WRITE_D. In addition, the current-voltage conversion circuit 220b may drive the first switch SW1 based on the generated second writing signal WRITE_D.

Figure 7A:
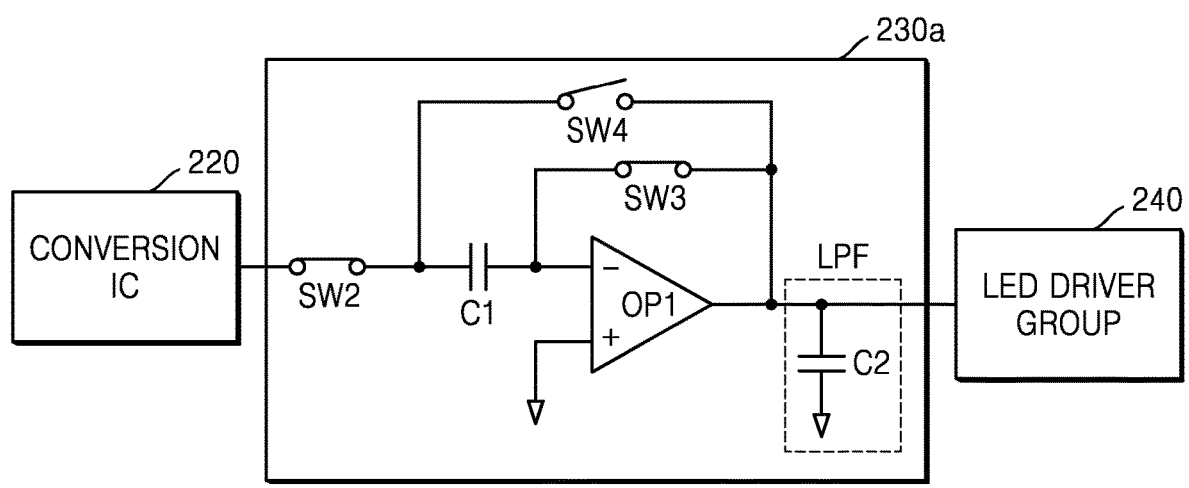
FIGS. 7A, 7B and 7C are diagrams illustrating a sample and hold circuit according to an example embodiment.
Figure 7B:
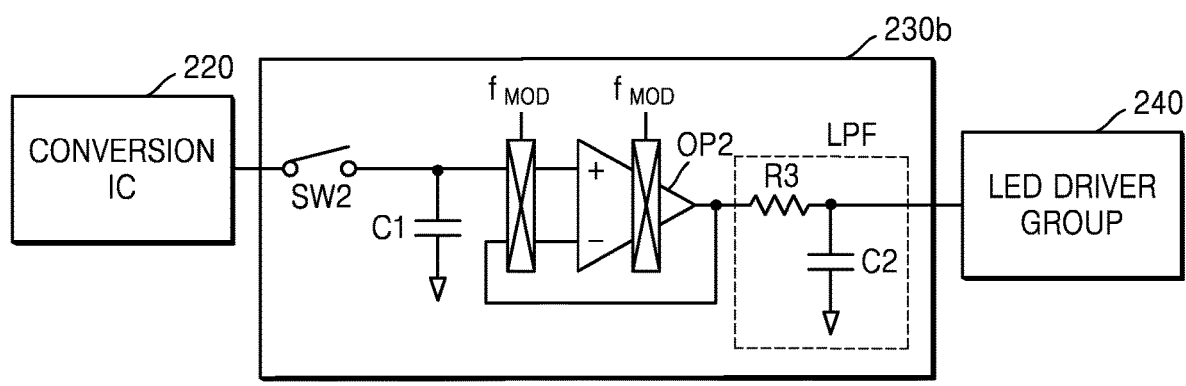
Figure 7C:
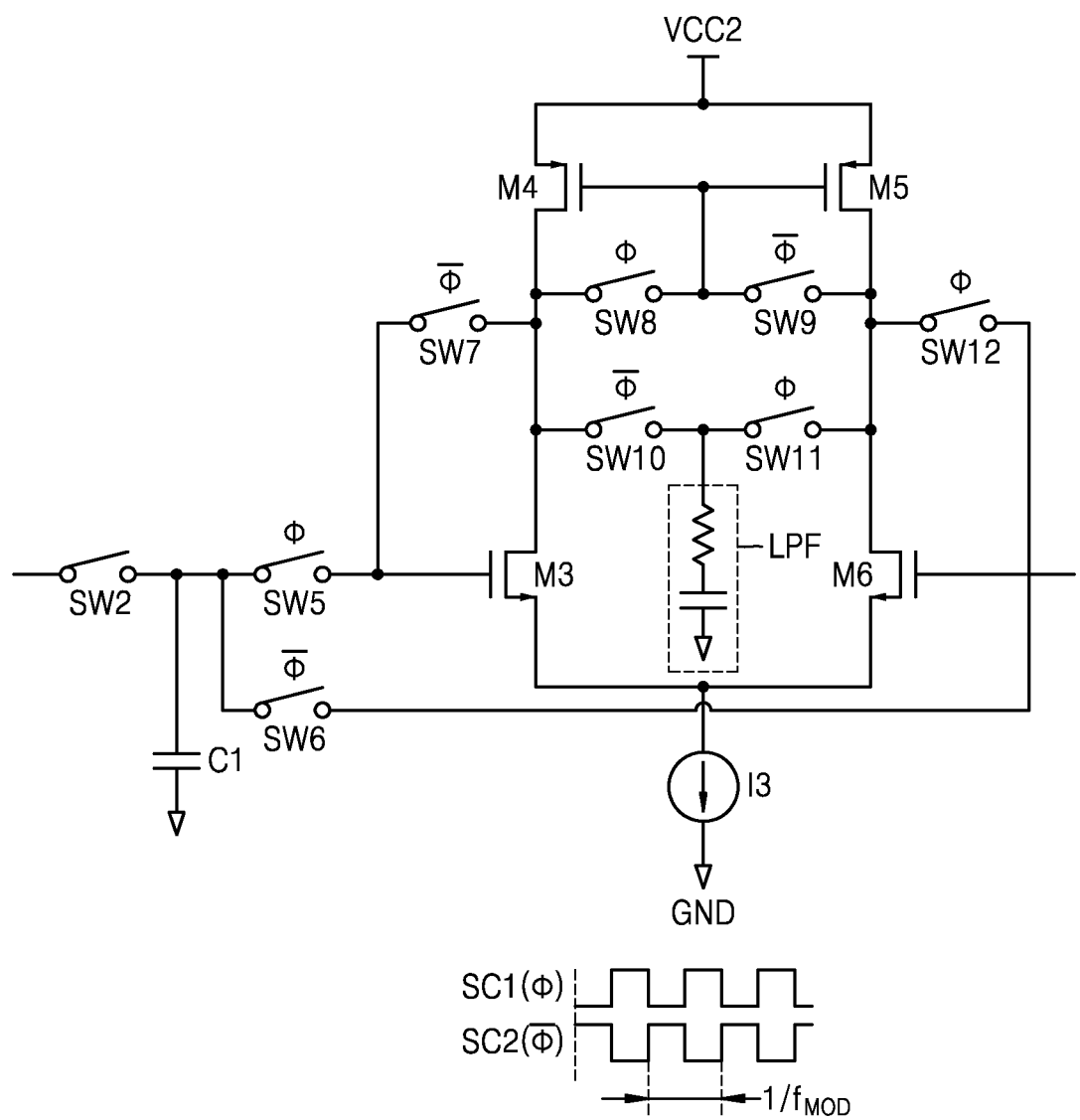

FIGS. 7A, 7B and 7C are diagrams illustrating sample and hold circuits 230a and 230b according to example embodiments. In detail, FIGS. 7A, 7B and 7C are diagrams illustrating modified examples of the sample and hold circuit 230 of FIG. 5.

The sample and hold circuit 230 of FIG. 5 may sample a voltage using the second switch SW2 and store and discharge the voltage using the first capacitor C1. Because the above-described structure stores a voltage using only the first capacitor C1, the sample and hold circuit 230 may correspond to the simplest circuit.

In a process of supplying or stopping the supply of current to LED elements through the sample and hold circuit 230, a drain voltage of the second transistor M2 included in the LED driver group 240 may change. A change in the voltage of the second transistor M2 may also affect a voltage stored in the first capacitor C1. Therefore, for the voltage stored in the first capacitor C1 to be stable, an analog buffer may be additionally included. Hereinafter, the sample and hold circuits 230a and 230b including the analog buffer will be described with reference to FIGS. 7A, 7B and 7C.

FIG. 7A illustrates a sample and hold circuit according to an example embodiment. Referring to FIG. 7A, the sample and hold circuit 230a may include the second switch SW2, the first capacitor C1, a first OPAMP OP1, a third switch SW3, and a fourth switch SW4. The sample and hold circuit 230a may further include a low pass filter LPF configured as a second capacitor C2, but example embodiments are not limited thereto, and the low pass filter LPF may be omitted.

Like the sample and hold circuit 230 of FIG. 5, the second switch SW2 may sample the voltage converted by the current-voltage conversion circuit 220, and the first capacitor C1 may store the sampled voltage. One end of the second switch SW2 may be connected to the current-voltage conversion circuit 220, and the other end may be connected to one end of the first capacitor C1. Further, a (−) terminal of the first OPAMP OP1 may be connected to the other end of the first capacitor C1 and one end of the third switch SW3, a (+) terminal of the first OPAMP OP1 may be grounded, and an output terminal of the first OPAMP OP1 may be connected to the other end of the third switch SW3 and one end of the fourth switch SW4. The other end of the fourth switch SW4 may be connected to a node between the second switch SW2 and the first capacitor C1. The third switch SW3 and the fourth switch SW4 operate opposite to each other, so that the first capacitor C1 may hold a voltage.

FIG. 7B illustrates a sample and hold circuit according to an example embodiment. Referring to FIG. 7B, the sample and hold circuit 230b may include a second OPAMP OP2, and may be implemented to change a connection relationship between input terminals of the second OPAMP OP2 based on a specific frequency fMOD, and also change a connection relationship between output terminals thereof based on the specific frequency fMOD. Accordingly, low-frequency noise having a large amplitude such as flicker noise may be effectively removed. The sample and hold circuit 230b may further include a low pass filter LPF including the second capacitor C2 and a third resistor R3, but example embodiments are not limited thereto, and the low pass filter LPF may be omitted.

FIG. 7C is a circuit diagram specifically showing the sample and hold circuit 230b of FIG. 7B. Referring to FIG. 7C, the second OPAMP OP2 of the sample and hold circuit 230b may include switches SW5, SW8, SW11, and SW12 operating according to a first switching control signal SC1, switches SW6, SW7, SW9, and SW10 operating according to a second switching control signal SC2, a plurality of transistors M3, M4, M5, and M6, and a current source 13. The first switching control signal SC1 and the second switching control signal SC2 have a period corresponding to a reciprocal of the specific frequency fMOD and have levels opposite to each other.

The pixel circuit 210 may further include a sample and hold controller capable of controlling the sample and hold circuits 230a and 230b. The sample and hold controller may control the first OPAMP OP1, the third switch SW3, and the fourth switch SW4 of the sample and hold circuit 230a, or the second OPAMP OP2 of the sample and hold circuit 230b. In some example embodiments, the sample and hold controller may be implemented in various forms such as a central processing unit (CPU), a processor, a microprocessor, an application processor (AP), a microcontroller unit (MCU), a microcomputer, or a mini computer.

In addition to the sample and hold circuits 230, 230a, and 230b according to the above-described example embodiments, circuits having various forms may be applied. For example, a circuit to which a half dummy switch is added may be applied. In addition, a circuit including an active element may also be applied in addition to an example embodiment in which the low pass filter LPF is configured as a capacitor or as a resistor and a capacitor.

In addition, with reference to FIGS. 5, 7A, and 7B, it is described that one pixel circuit 210 may include one sample and hold circuit 230, 230a, or 230b, but one pixel circuit 210 may include the plurality of sample and hold circuits 230, 230a, and 230b and the plurality of sample and hold circuits 230, 230a, and 230b may be implemented to provide a voltage to the K LED elements LED_1, LED_2, and LED_K. For example, when n sample and hold circuits 230, 230a, and 230b are included, each of the sample and hold circuit 230, 230a, 230b may be implemented to provide the voltage to K/n LED elements.

In another example embodiment, one pixel circuit 210 may include one sample and hold circuit 230a or 230b, but the sample and hold circuits 230a and 230b may include the plurality of analog buffers OPAMP OP1 and OP2. That is, the sample and hold circuits 230a and 230b include only one first capacitor C1 that stores the converted voltage, but may include the plurality of analog buffers OP1 and OP2 connected to the first capacitor C1. The plurality of analog buffers OP1 and OP2 may be implemented to provide the voltage to the K LED elements LED_1, LED_2, and LED_K.

Figure 8A:
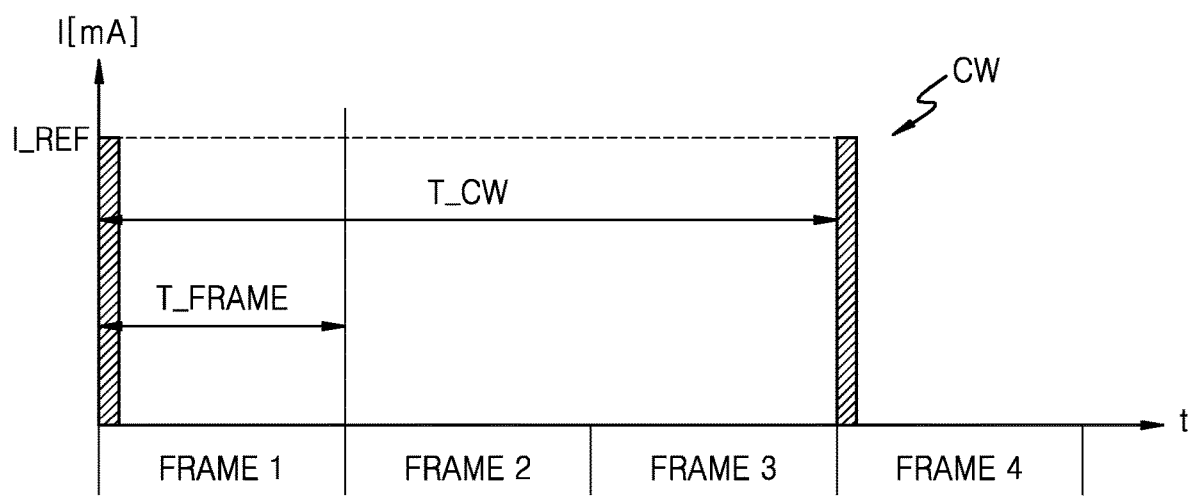
FIG. 8A is a diagram illustrating a current writing (CW) operation to which a pulse width modulation (PWM) method is applied according to an example embodiment.
Figure 8B:
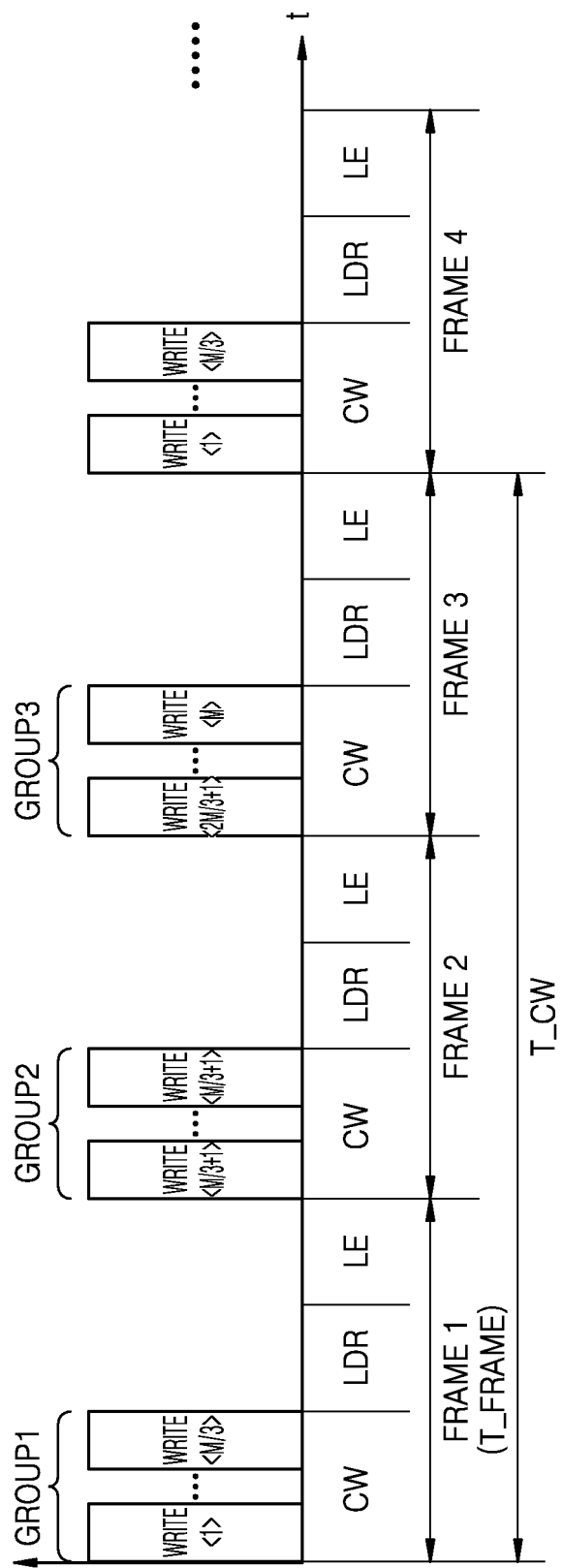
FIG. 8B is a diagram showing a modified example embodiment.

FIGS. 8A and 8B are diagrams illustrating CW operations according to example embodiments.

The panel driver 100 may drive LED elements of the backlight unit 1500 by providing a current to the pixel circuit group 200 in various ways. A current providing method may include a pulse amplitude modulation (PAM) method that changes a magnitude of the current, the PWM method that changes an output duty ratio of the current, and a hybrid method that simultaneously applies the PAM method and the PWM method.

Because the panel driver 100 provides a reference current to the pixel circuits 210 only in a first period of a frame period, the panel driver 100 may basically operate through the PWM method. In this way, because the reference current is not provided in the entire frame period, an amount of current consumption may be reduced.

According to example embodiments, the panel driver 100 may further reduce the current consumption. Specifically, the panel driver 100 does not provide the reference current for every frame period, but provides the reference current for every preset number of frame periods, thereby further reducing the amount of current consumption. In other words, the panel driver 100 may perform the CW operation at a period corresponding to the preset number of frame periods (hereinafter, referred to as a CW period). In this regard, when a sufficient magnitude of reference current is stored by one CW operation, the LED elements may emit light during a plurality of frame periods using the stored reference current.

For example, referring to FIG. 8A, the panel driver 100 may be implemented to provide the reference current in a CW period T_CW corresponding to three frame periods. The panel driver 100 may provide the reference current I_REF to the pixel circuits 210 in a frame period of the first frame FRAME 1. In addition, the panel driver 100 may omit a provision of the reference current I_REF in frame periods of the second frame FRAME 2 and a third frame FRAME 3. In addition, the panel driver 100 may provide the reference current I_REF to the pixel circuits 210 again in a frame period of the fourth frame FRAME 4. In addition, the panel driver 100 may also provide a writing signal indicating a performing time of the CW operation when the reference current I_REF is provided. The pixel circuits 210 may perform the CW operation of storing the reference current I_REF provided in the frame periods corresponding to the first frame FRAME 1 and the fourth frame FRAME 4 according to the writing signal.

The CW period T_CW may be set based on a capacitance of the first capacitor C1 of the sample and hold circuit 230, a magnitude of leakage current of the second switch SW2, and a temperature change characteristic of the second transistor M2 of the LED driving group 240.

According to example embodiments, the pixel circuits 210 may be divided into a plurality of groups, and frame periods in which the plurality of groups perform the CW operation may be set differently from each other.

For example, referring to FIG. 8B, the pixel circuits 210 may be divided into three groups. Further, among the three groups, a first group GROUP 1 may perform the CW operation in the first frame FRAME 1, a second group GROUP 2 may perform the CW operation in the second frame FRAME 2, and a third group GROUP 3 may perform the CW operation in the third frame FRAME 3. In addition, the three groups may repeat the CW operation for every CW period T_CW. The panel driver 100 may provide a writing signal indicating a performing time of the CW operation for each of the three groups.

Figure 9:
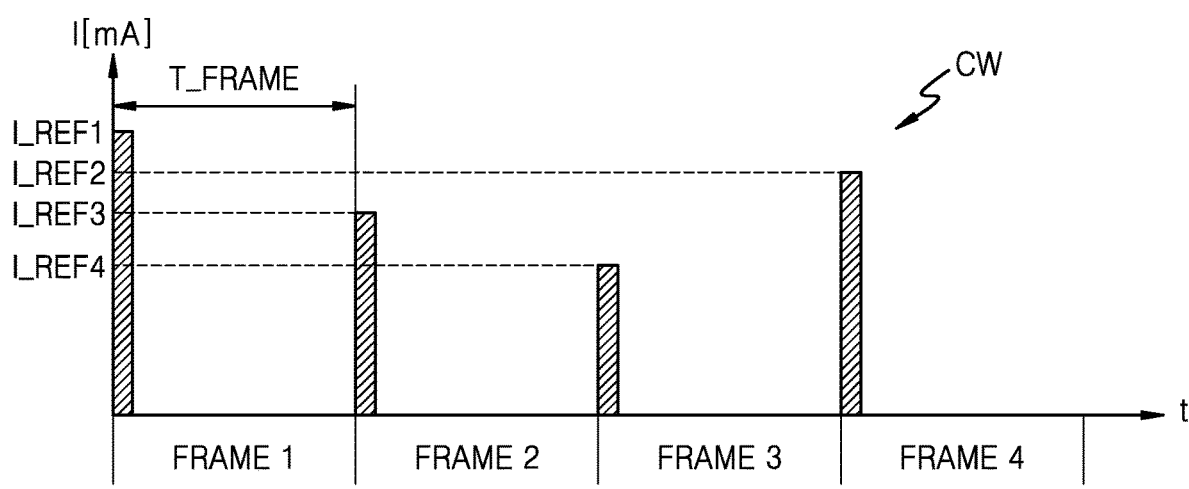
FIG. 9 is a diagram illustrating a CW operation to which a pulse amplitude modulation (PAM) method and a PWM method are applied according to an example embodiment.

FIG. 9 is a diagram illustrating a CW operation according to an example embodiment in which a PAM method and a PWM method are applied.

In some example embodiments, in order to further improve a contrast ratio of an image displayed on the display panel 1400, the panel driver 100 may provide a current through a hybrid method to which the PAM method is additionally applied to the PWM method. For example, in a case where a luminance of the image displayed on the display panel 1400 is very high, when the panel driver 100 increases a magnitude of a reference current according to the PAM method, LED elements of the backlight unit 1500 may also provide brighter lighting, and accordingly, a contrast ratio may be improved.

When providing the reference current through the hybrid method, the panel driver 100 may receive the luminance data LDT from the timing controller 1100, determine the magnitude of the reference current based on the received luminance data LDT, and provide the reference current having a determined magnitude to the pixel circuits 210. Because the luminance data LDT may be generated for each frame, the panel driver 100 may change the magnitude of the reference current for each frame period.

For example, referring to FIG. 9, the panel driver 100 may receive first luminance data of the first frame FRAME 1, determine a magnitude of current based on the received first luminance data, and provide a reference current I_REF1 having the determined magnitude to the pixel circuits 210. In addition, the pixel circuits 210 may perform a CW operation of storing the provided reference current I_REF1. In addition, the panel driver 100 may receive second luminance data of the second frame FRAME 2, determine a magnitude of current based on the received second luminance data, and provide a reference current I_REF2 having the determined magnitude to the pixel circuits 210. In addition, the pixel circuits 210 may perform the CW operation of storing the provided reference current I_REF2.

In the above-described example, it is described that the panel driver 100 receives the luminance data LDT from the timing controller 1100 and determines the magnitude of the reference current based on the luminance data LDT, but example embodiments are not limited thereto. For example, the panel driver 100 may be implemented to receive image data IDT or pixel RGB_DT and determine the magnitude of the reference current based on the received image data IDT or the pixel RGB_DT.

Figure 10A:
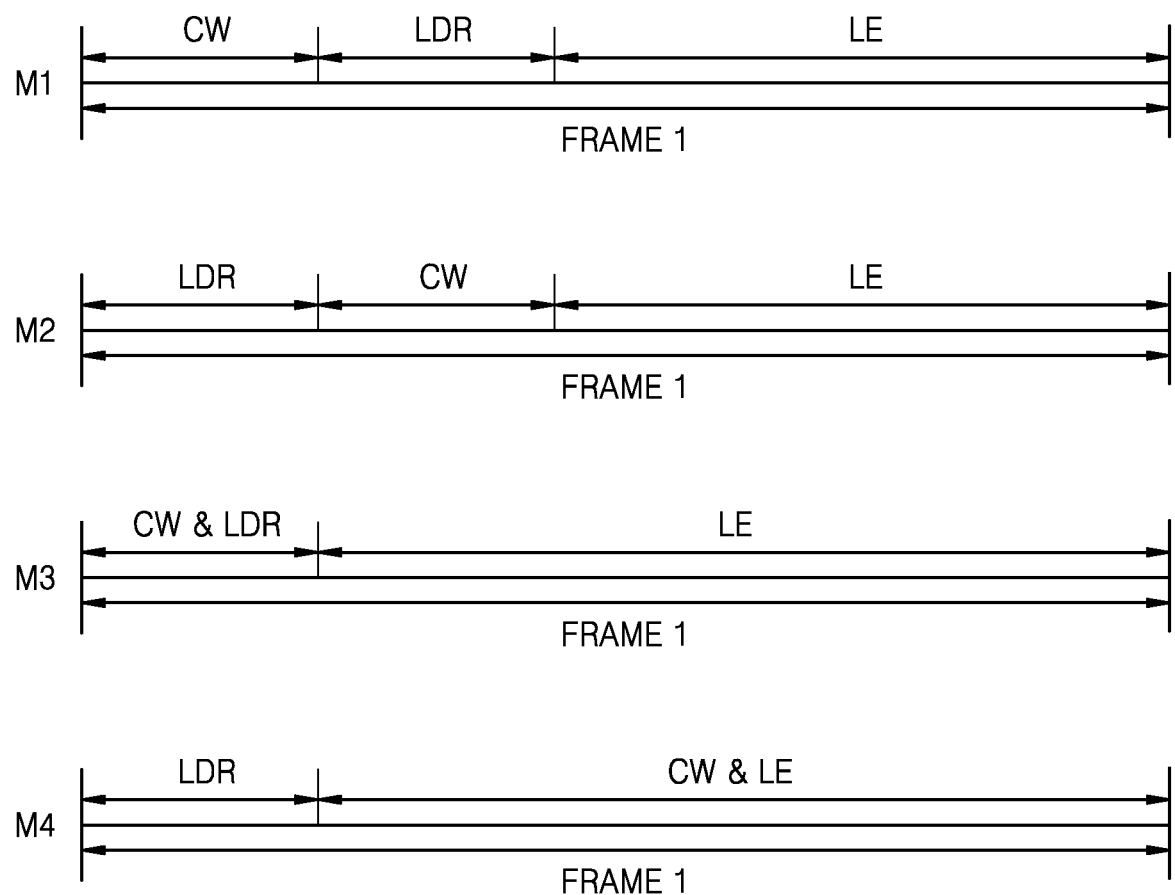
FIGS. 10A, 10B and 10C are diagrams illustrating operations of a backlight driver for each frame period according to example embodiments.
Figure 10B:
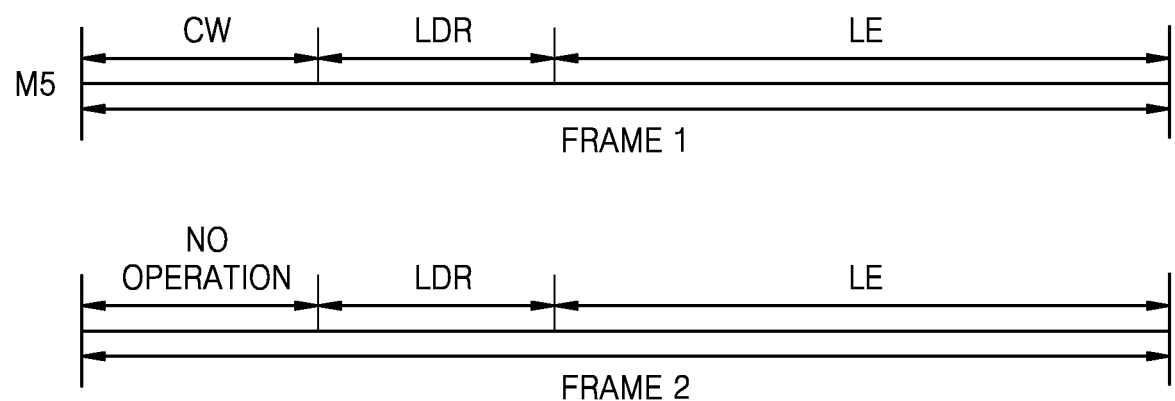
Figure 10C:
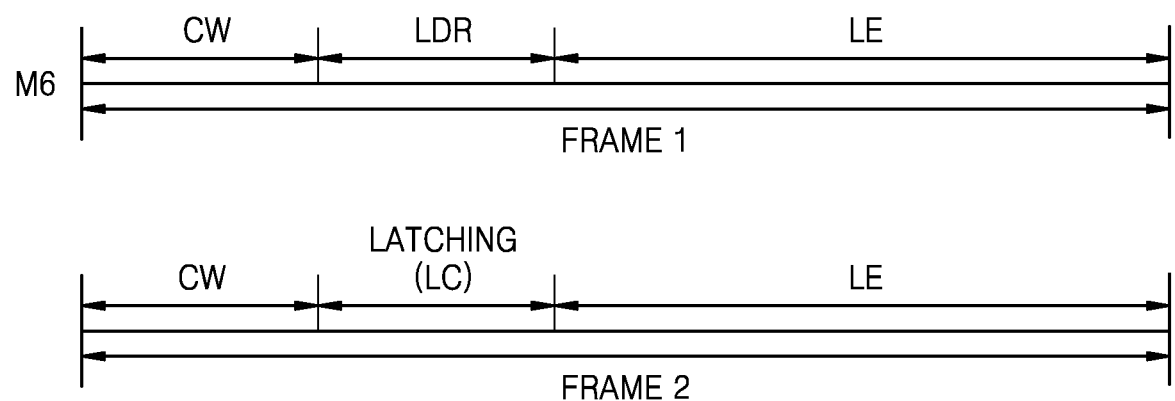

FIGS. 10A, 10B and 10C are diagrams illustrating operations of the backlight driver 1600 for each frame period according to example embodiments.

Referring to FIG. 10A, as described above in FIG. 4, the backlight driver 1600 may operate in a first method M1 of performing first a CW operation, then an LDR operation, and finally, an LE operation.

The CW operation and the LDR operation may be performed independently of each other. Accordingly, the CW operation may be implemented to be performed later than the LDR operation. For example, referring to FIG. 10A, the backlight driver 1600 may operate in a second method M2 of performing first the LDR operation, then the CW operation, and finally, the LE operation.

Alternatively, the CW operation may be implemented to be performed simultaneously with the LDR operation. For example, referring to FIG. 10A, the backlight driver 1600 may operate in a third method M3 of performing simultaneously the CW operation and the LDR operation, and finally the LE operation.

Alternatively, the CW operation may be implemented to be performed simultaneously with the LE operation. For example, referring to FIG. 10A, the backlight driver 1600 may operate in a fourth method M4 of performing the LDR operation and then simultaneously the CW operation and the LE operation.

According to an example embodiment, the backlight driver 1600 may operate in a manner in which the CW operation or the LDR operation is omitted. For example, the panel driver 100 may not provide a reference current for every frame period, but may be implemented to provide the reference current for each preset number of frame periods. In this case, the backlight driver 1600 may omit the CW operation in some frame periods.

For example, referring to FIG. 10B, the backlight driver 1600 may sequentially perform the CW operation, the LDR operation, and the LE operation in the first frame FRAME 1. In addition, the backlight driver 1600 may omit the CW operation and sequentially perform the LDR operation and the LE operation in the second frame FRAME 2. In this regard, in a period allocated to the existing CW operation, the backlight driver 1600 may not perform a separate operation. However, example embodiments are not limited thereto, and the backlight driver 1600 may perform the LDR operation earlier and perform the LE operation longer in the above period. The backlight driver 1600 may operate in the same manner as the second frame FRAME 2 until it is the CW operation is necessary. As described above, the backlight driver 1600 may operate in a fifth method M5 in which the CW operation is omitted in some frame periods.

As another example, when consecutive frames have the same luminance, the backlight driver 1600 may omit the LDR operation in some frame periods. For example, when a luminance of a previous frame is the same as that of a current frame, because the luminance data LDT of the previous frame is also the same as that of the current frame, the timing controller 1100 may omit a transmission of the luminance data LDT to the backlight driver 1600. In this case, the backlight driver 1600 may latch and reuse the luminance data LDT of the previous frame.

For example, referring to FIG. 10C, the backlight driver 1600 may sequentially perform the CW operation, the LDR operation, and the LE operation in the first frame FRAME 1. In addition, the backlight driver 1600 may perform the CW operation in the second frame FRAME 2, latch the luminance data LDT of the first frame FRAME 1 instead of the LDR operation, and perform the LE operation. As described above, the backlight driver 1600 may operate in a sixth method M6 in which the LDR operation is omitted from some frame periods.

With reference to FIGS. 10B and 10C, the fifth method M5 and the sixth method M6 are illustrated and described to perform the LDR operation after performing the CW operation, but example embodiments not limited thereto. For example, the fifth method M5 and the sixth method M6 may also change an arrangement of the CW operation and the LDR operation like the first method M1 to the fourth method M4.

In addition, the first method M1 to the fifth method M5 may be applied regardless of a current providing method (e.g., the PWM method, and the hybrid method). That is, in each of the first method M1, the second method M2, the third method M3, the fourth method M4 and the fifth method M5, the CW operation may be performed by providing a current of a certain magnitude in a time-division method according to the PWM method, or providing a current having magnitude changing for each frame period according to the hybrid method.

Figure 11:
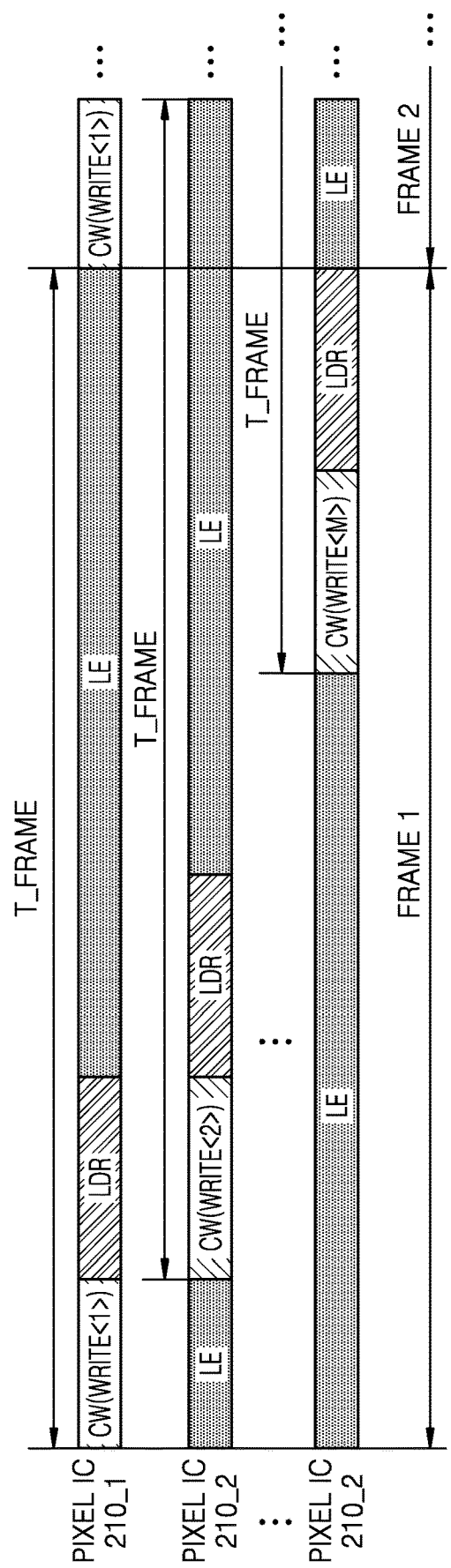
FIG. 11 is a diagram illustrating operations of pixel circuits for each frame period according to an example embodiment.

FIG. 11 is a diagram illustrating operations of the pixel circuits 210 for a frame period according to an example embodiment.

As described above with reference to FIGS. 1 to 10, the backlight driver 1600 may perform a CW operation in a first period of a frame period, perform an LDR operation in a second period of the frame period, and perform an LE operation in a third period of the frame period. Because the CW operation is performed by sequentially providing current to each of the pixel circuits 210, each of the pixel circuits 210 may wait in the remaining time other than a performing time of CW of the corresponding pixel circuit 210 in the first period.

According to an example embodiment, the backlight driver 1600 may be implemented to have separate periods in which the CW operation, the LDR operation, and the LE operation are performed with respect to each of the pixel circuits 210. For example, the backlight driver 1600 may sequentially provide current to each of the pixel circuits 210 while each of the pixel circuits 210 may perform the following operation immediately after the CW operation is completed. The pixel circuits 210 may be implemented to perform the above operations with the same period (e.g., the frame period T_FRAME).

For example, referring to FIG. 11, the first pixel circuit 210_1 may perform the CW operation based on the writing signal WRITE<1> in the frame period T_FRAME. In addition, when the CW operation is completed, the first pixel circuit 210_1 may then perform the LDR operation. In addition, when the LDR operation is completed, the first pixel circuit 210_1 may then perform the LE operation.

In addition, the second pixel circuit 210_2 may perform the CW operation based on the writing signal WRITE<2> after the CW operation of the first pixel circuit 210_1 is completed in the frame period T_FRAME. In addition, when the CW operation is completed, the second pixel circuit 210_2 may then perform the LDR operation. In addition, when the LDR operation is completed, the first pixel circuit 210_1 may then perform the LE operation. The LE operation of the second pixel circuit 210_2 may not be completed within one frame period T_FRAME, but may be performed over a next frame period.

When operating in this manner, the pixel circuits 210 may perform the LE operation for a longer time by utilizing the existing waiting time. Therefore, even though the magnitude of the reference current does not increase, a magnitude of illumination of the backlight unit 1500 may increase.

Figure 12:
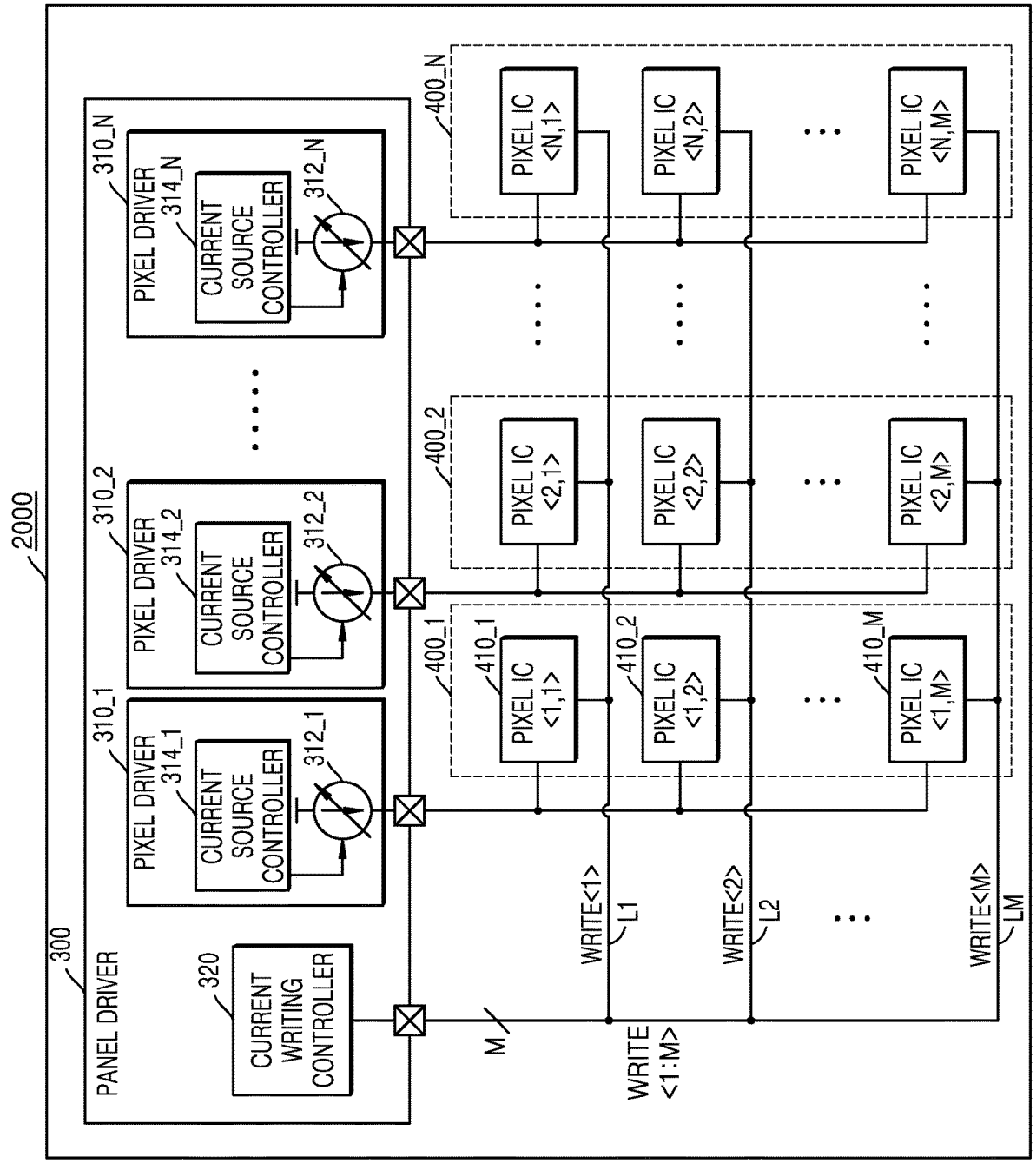
FIG. 12 is a block diagram illustrating a backlight driver according to an example embodiment.

FIG. 12 is a block diagram illustrating a backlight driver 2000 according to an example embodiment. In detail, FIG. 12 is a block diagram showing a modified example of the backlight driver 1600 of FIG. 3. In the description of the backlight driver 2000 of FIG. 12, redundant description with that of the backlight driver 1600 of FIG. 3 will be omitted.

Referring to FIG. 12, the backlight driver 2000 may include a panel driver 300 and a plurality of pixel circuit groups 400_1, 400_2, and 400_N. Each of the plurality of pixel circuit groups 400_1, 400_2, and 400_N may include M (M is a positive integer) pixel circuits 410_1, 410_2, and 410_M, and the pixel circuits 410_1, 410_2, and 410_M may drive at least one LED element of the backlight unit 1500. The number of LED elements driven by the pixel circuits 410_1, 410_2, and 410_M may be the same or different. The pixel circuits 410_1, 410_2, and 410_M may respectively correspond to the pixel circuits 410_1, 410_2, and 410_M of FIG. 3.

The panel driver 300 may include a plurality of pixel drivers 310_1, 310_2, and 310_N respectively corresponding to the plurality of pixel circuit groups 400_1, 400_2, and 400_N. For example, the first pixel driver 310_1 may correspond to the first pixel circuit group 400_1, the second pixel driver 310_2 may correspond to the second pixel circuit group 400_2, and the N-th pixel driver 310_N may correspond to the Nth pixel circuit group 400_N.

The plurality of pixel drivers 310_1, 310_2, and 310_N may respectively include the current sources 312_1, 312_2, and 312_N and the current source controllers 314_1, 314_2, and 314_N. The plurality of pixel drivers 310_1, 310_2, and 310_N may provide the reference current to a corresponding pixel circuit group.

The panel driver 300 may include a CW controller 320. The CW controller 320 may output writing signals WRITE<1:M> indicating a performing time of a CW operation in response to provision of the reference current. The writing signal WRITE<1:M> may be provided through M lines L1 to LM connected to the CW controller 320, and the M lines L1 to LM may be connected in parallel to the pixel circuits 410_1, 410_2, and 410_M of the plurality of pixel circuit groups 400_1, 400_2, and 400_N. For example, the writing signal WRITE<1> may be provided to the first pixel circuit 410_1 of each of the plurality of pixel circuit groups 400_1, 400_2, and 400_N through the first line L1. In addition, the writing signal WRITE<2> may be provided to the second pixel circuit 410_2 of each of the plurality of pixel circuit groups 400_1, 400_2, and 400_N through the second line L2. The writing signal WRITE<M> may be provided to the Mth pixel circuit 410_M of each of the plurality of pixel circuit groups 400_1, 400_2, and 400_N through the Mth line LM.

Although the backlight driver 2000 of FIG. 12 is different from the backlight driver 1600 of FIG. 3 in that the backlight driver 2000 of FIG. 12 includes the plurality of pixel drivers 310_1, 310_2, and, 310_N and the plurality of pixel circuit groups 400_1, 400_2, and 400_N, the backlight driver 2000 of FIG. 12 may operate in substantially the same manner as the example embodiments described above in FIGS. 4 to 11.

Figure 13:
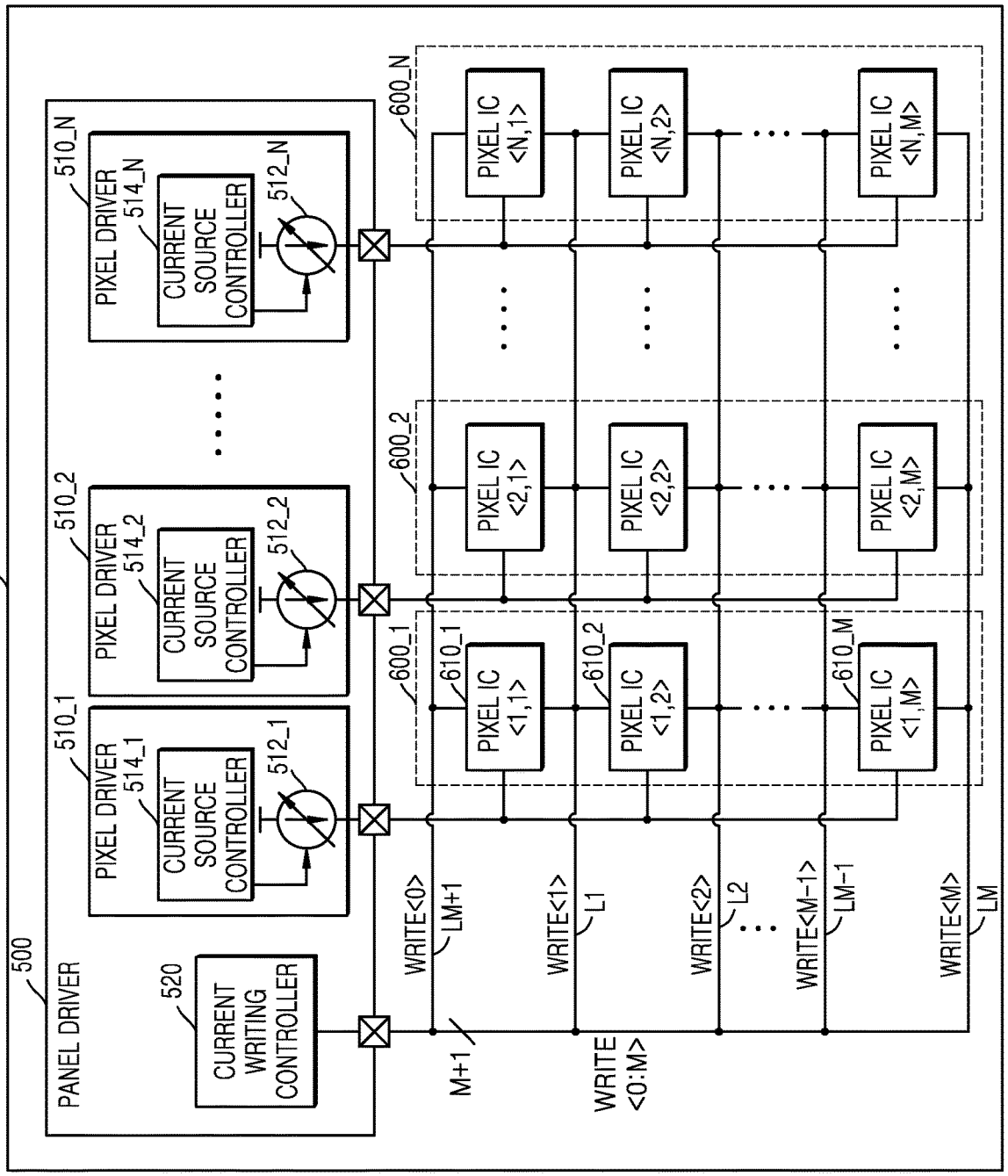
FIG. 13 is a block diagram illustrating a backlight driver according to an example embodiment.

FIG. 13 is a block diagram illustrating a backlight driver 3000 according to an example embodiment. In detail, FIG. 13 is a block diagram showing a modified example of the backlight driver 2000 of FIG. 12. In the description of the backlight driver 3000 of FIG. 13, redundant description with that of the backlight driver 2000 of FIG. 12 will be omitted.

Referring to FIG. 13, the backlight driver 3000 may include a panel driver 500 and a plurality of pixel circuit groups 600_1, 600_2, and 600_N. The plurality of pixel circuit groups 600_1, 600_2, and 600_N may respectively correspond to the plurality of pixel circuit groups 400_1, 400_2, and 400_N of FIG. 12. The panel driver 500 may include a plurality of pixel drivers 510_1, 510_2, and 510_N respectively corresponding to the plurality of pixel circuit groups 600_1, 600_2, and 600_N. The plurality of pixel drivers 510_1, 510_2, and 510_N may respectively include current sources 512_1, 512_2, and 512_N and current source controllers 514_1, 514_2, and 514_N.

The panel driver 500 may include a CW controller 520. According to an example embodiment, the CW controller 520 may additionally output a writing signal WRITE<0> when compared with the CW controller 320 of FIG. 12. That is, the CW controller 520 may output writing signals WRITE<0:M> through M+1 lines L1 to LM+1.

For example, referring to FIGS. 12 and 13, the M+1 lines L1 to LM+1 of the backlight driver 3000 of FIG. 13 include the M+1th line LM+1 transmitting the writing signal WRITE<0> added to the M lines L1 to LM of the backlight driver 2000 of FIG. 12. The M+1th line LM+1 may be connected to the first pixel circuit 610_1 of each of the plurality of pixel circuit groups 600_1, 600_2, and 600_N.

In addition, each of the first line L1 to an M−1th line LM−1 transmitting the writing signals WRITE<1:M−1> may be additionally connected to one pixel circuit. For example, referring to FIGS. 12 and 13, the first line L1 of FIG. 12 is connected only to the first pixel circuit 410_1, but the first line L1 of FIG. 13 may be connected not only to the first pixel circuit 610_1 but also to the second pixel circuit 610_2 adjacent to the first pixel circuit 610_1. Further, the second line L2 of FIG. 13 may be connected not only to the second pixel circuit 610_2 but also to a third pixel circuit adjacent to the second pixel circuit 610_2. Further, the M−1th line LM−1 of FIG. 13 may be connected not only to an M−1th pixel circuit, but also to the Mth pixel circuit 610_M adjacent to the M−1th pixel circuit.

In summary, only one pixel circuit may be connected to the M+1th line and Mth line that transmit the writing signals WRITE<0> and WRITE<M>, and the first line to the M−1th line that transmit the writing signals WRITE<1:M−2> may be connected to two adjacent pixel circuits. Accordingly, each of the pixel circuits 610_1, 610_2, and 610_M may receive two writing signals through two lines.

According to an example embodiment, the CW controller 520 may sequentially generate the writing signals WRITE<0:M> to have an active level. In addition, each of the pixel circuits 610_1, 610_2, and 610_M may perform the CW operation based on one writing signal, and the LDR operation based on another writing signal.

For example, referring to FIG. 13, the first pixel circuit 610_1 may perform the LDR operation based on the writing signal WRITE<0> and perform the CW operation based on the writing signal WRITE<1>. In addition, the second pixel circuit 610_2 may perform the LDR operation based on the writing signal WRITE<1> and perform the CW operation based on the writing signal WRITE<2>. Also, the M-th pixel circuit 610_M may perform the LDR operation based on the writing signal WRITE<M−1>, and perform the CW operation based on the writing signal WRITE<M>. However, example embodiments are not limited thereto, and for example, the first pixel circuit 610_1 may perform the CW operation based on the writing signal WRITE<0>, and perform the LDR operation based on the writing signal WRITE<1>.

As described above, the CW controller 520 may transmit performing times of the LDR operation and the CW operation to the pixel circuits 610_1, 610_2, and 610_M by using the writing signals WRITE<0:M> including the added writing signal WRITE<0>. Accordingly, the pixel circuits 610_1, 610_2, and 610_M do not need to receive the enable signal EN indicating the performing time of the LDR operation described in FIG. 5, and lines transmitting the enable signal EN to each of the pixel circuits 610_1, 610_2, and 610_M may be omitted.

That is, the backlight driver 3000 may add one line transmitting the writing signal WRITE<0>, thereby omitting lines transmitting the enable signal EN to each of the pixel circuits 610_1, 610_2, and 610_M, and thus the manufacturing costs may be reduced and products may be reduced.

According to another example, the M+1th line LM+1 transmitting the writing signal WRITE<0> may be implemented to be connected to all of the pixel circuits 610_1, 610_2, and 610_M. That is, like the backlight driver 2000 of FIG. 12, each of the M lines L1 to LM transmitting the writing signals WRITE<1:M> may be implemented to be connected to one pixel circuit, and only the M+1th line LM+1 transmitting the writing signal WRITE<0> may be implemented to be connected to all of the pixel circuits 610_1, 610_2, and 610_M.

In this case, the CW controller 520, as described above with respect to FIG. 12, may generate the writing signal WRITE<1:M> indicating the performing time of the CW operation of each of the pixel circuits 610_1, 610_2, and 610_M and generate the writing signal WRITE<0> indicating the performing time of the LDR operation of the pixel circuits 610_1, 610_2, and 610_M. That is, the writing signal WRITE<0> may serve as the enable signal EN described above in FIG. 5. Accordingly, even in this case, the lines transmitting the enable signal EN to each of the pixel circuits 610_1, 610_2, and 610_M may be omitted.

Figure 14:
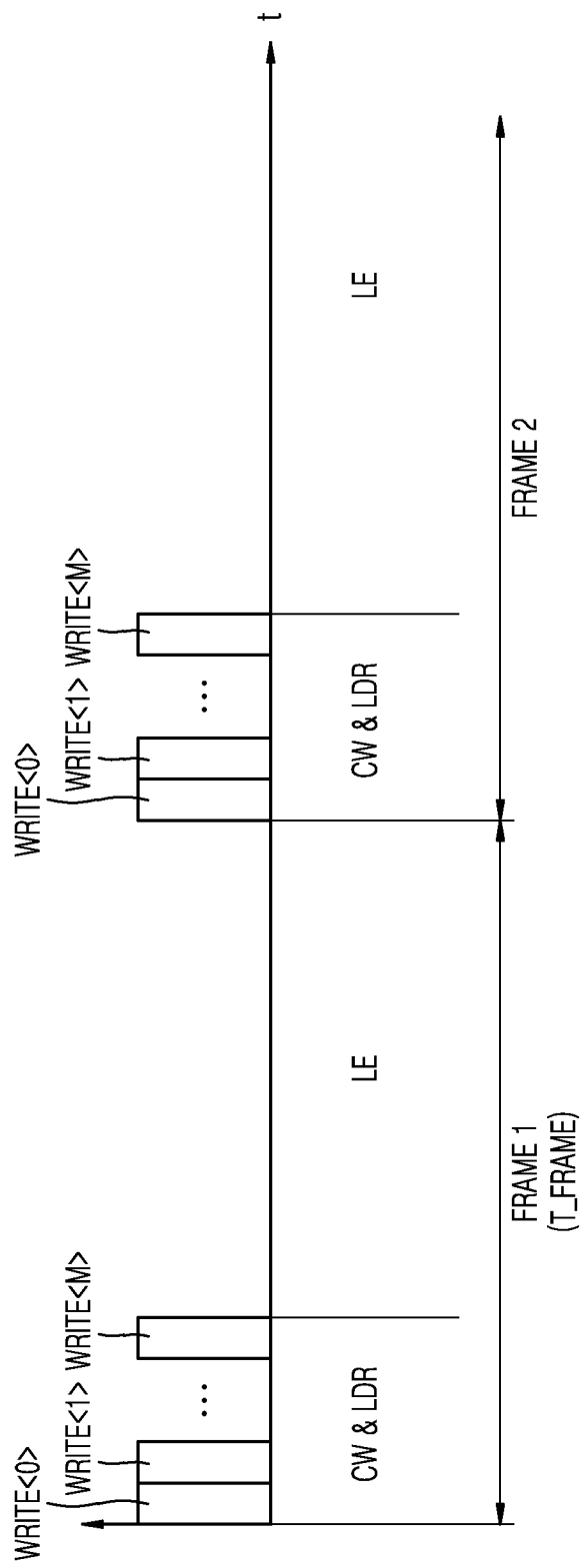
FIG. 14 is a diagram illustrating operations of the backlight driver of FIG. 13 for each frame period according to an example embodiment.

FIG. 14 is a diagram illustrating operations of the backlight driver 3000 of FIG. 13 for each frame period according to an example embodiment.

The backlight driver 3000 may also operate in units of frame periods. For example, referring to FIG. 14, the backlight driver 3000 may simultaneously perform a CW operation and an LDR operation in a frame period corresponding to the first frame FRAME 1.

Specifically, the writing signal WRITE<0:M> may be sequentially generated to have an active level, and each of the plurality of pixel circuits 610_1, 610_2, and 610_M may sequentially perform the CW operation and the LDR operation according to the corresponding writing signal.

For example, referring to FIGS. 13 and 14, the first pixel circuit 610_1 may perform the LDR operation when the writing signal WRITE<0> has the active level, and perform the CW operation when the writing signal WRITE<1> has the active level. In addition, the second pixel circuit 610_2 may perform the LDR operation when the writing signal WRITE<1> has the active level, and perform the CW operation when the writing signal WRITE<2> has the active level.

In addition, when the CW operation and the LDR operation of the plurality of pixel circuits 610_1, 610_2, and 610_M are completed, the backlight driver 3000 may perform the LE operation.

When the writing signal WRITE<0> described above in FIG. 14 is connected to all of the pixel circuits 610_1, 610_2, and 610_M, the pixel circuits 610_1, 610_2, and 610_M may perform the LDR operation when the writing signal WRITE<0> has the active level, and perform the CW operation when the remaining writing signals WRITE<1:M> have the active level sequentially. In addition, when the CW operation of the pixel circuits 610_1, 610_2, and 610_M is completed, the LE operation may be performed.

As illustrated and described with respect to FIG. 14, the writing signal WRITE<0>, the writing signal WRITE<1>, and the writing signal WRITE<M> sequentially have active levels, but example embodiments are not limited thereto, and the order in which the writing signals WRITE<0:M> have the active level may be implemented in various ways.

Figure 15:
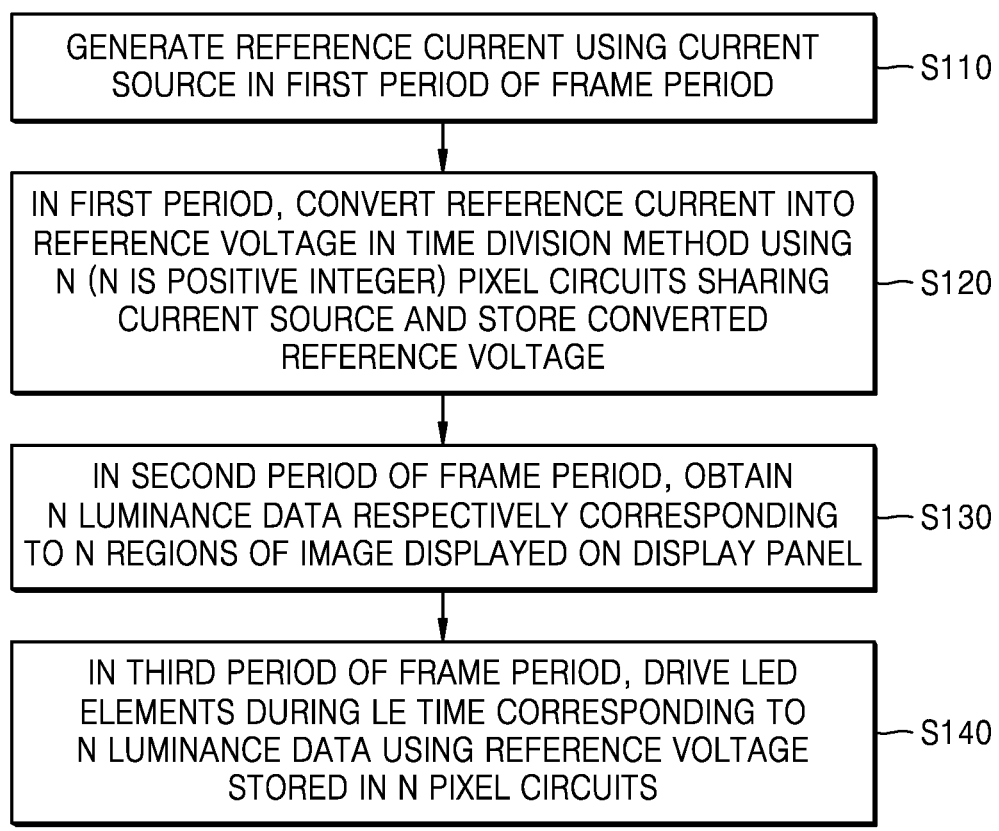
FIG. 15 is a flowchart illustrating a method of driving a backlight device according to an example embodiment.

FIG. 15 is a flowchart illustrating a method of driving the backlight device 1700 according to an example embodiment. The operation method of FIG. 15 may be performed by the backlight device 1700 of FIG. 1.

Referring to FIG. 15, the backlight device 1700 may generate a reference current using a current source in a first period of a frame period (S110). In addition, in the first period, the backlight device 1700 may convert the reference current in a time division method using N (N is a positive integer) pixel circuits that share the current source, and store the converted reference voltage (S120). Each of the N pixel circuits may include a conversion circuit converting the reference current into a reference voltage, and a sample and hold circuit sampling and storing the reference voltage.

In addition, the backlight device 1700 may obtain N luminance data respectively corresponding to N regions of an image displayed on a display panel in a second period of the frame period (S130). In addition, in a third period of the frame period, the backlight device 1700 may drive LED elements during an LE time corresponding to the N luminance data using the reference voltage stored in the N pixel circuits (S140).

Figure 16:
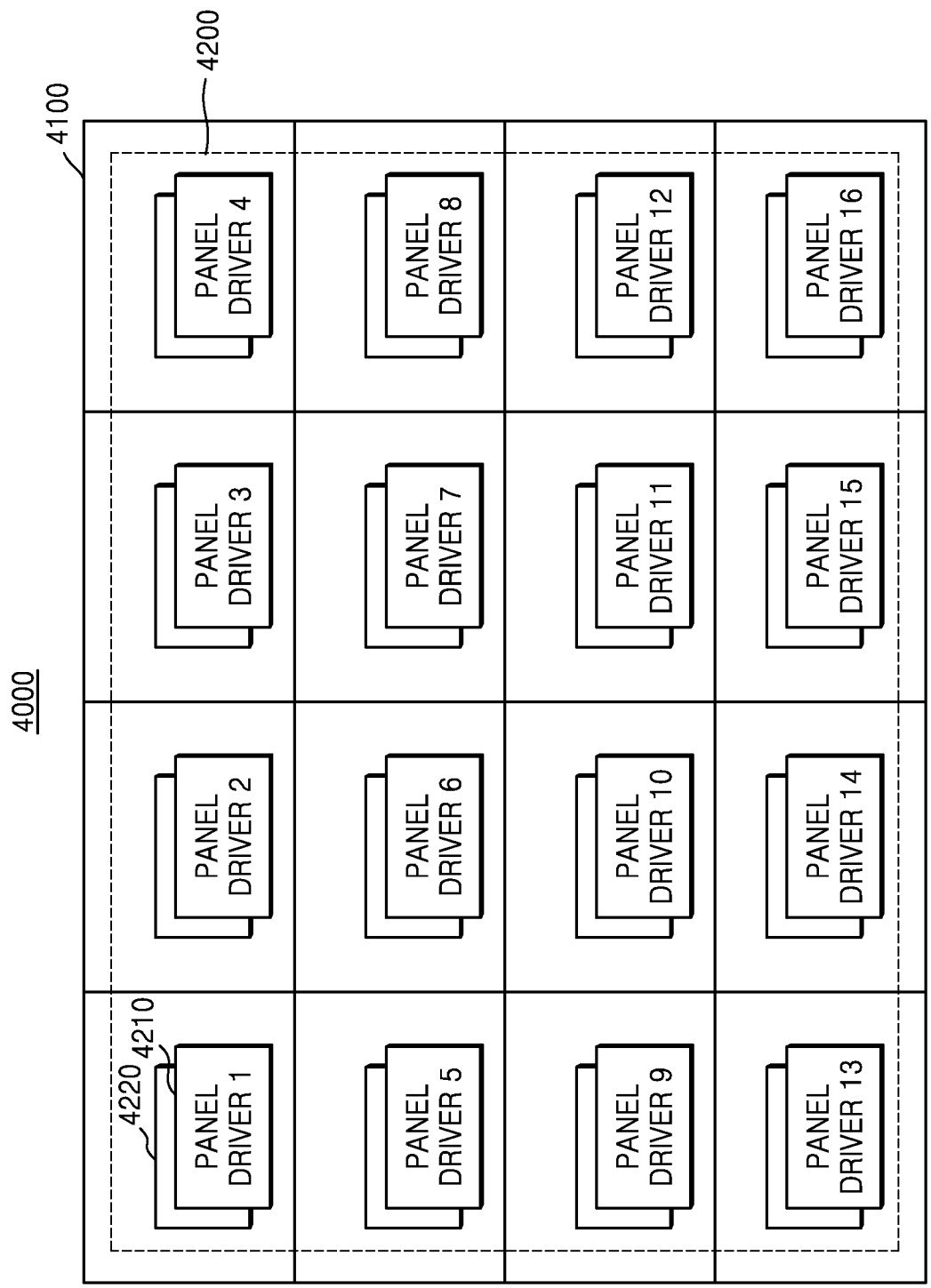
FIG. 16 is a diagram illustrating a backlight device according to an example embodiment.

FIG. 16 is a diagram illustrating a backlight device 4000 according to an example embodiment.

The backlight device 4000 may include backlight unit 4100 and backlight driver 4200. Like the backlight unit 1500 described above in FIG. 2, the backlight unit 4100 of FIG. 16 may be divided into a plurality of dimming groups, and the backlight driver 4200 may drive the backlight unit 4100 for each of a plurality of dimming groups.

In some example embodiments, the backlight driver 4200 may include a plurality of panel drivers 4210 and a plurality of pixel circuit groups 4220 to drive the backlight unit 4100 for each of a plurality of dimming groups. The panel driver 4210 and the pixel circuit group 4220 may respectively correspond to the panel driver 100 and the pixel circuit group 200 of FIG. 3.

The backlight unit 4100 may include the same number of plurality of panel drivers 4210 and plurality of pixel circuit groups 4220. The plurality of panel drivers 4210 and the plurality of pixel circuit groups 4220 may respectively correspond to the plurality of dimming groups, and may drive LED elements of the corresponding dimming groups. The plurality of panel drivers 4210 and the plurality of pixel circuit groups 4220 may be disposed adjacent to regions in which the LED elements of the corresponding dimming groups are located.

For example, referring to FIG. 16, when the backlight unit 4100 is divided into dimming groups of a 4×4 arrangement, the backlight driver 4200 may include 16 panel drivers 4210 and 16 pixel circuit groups 4220. The 16 panel drivers 4210 and the 16 pixel circuit groups 4220 may be disposed adjacent to regions in which the corresponding dimming groups are located among the 16 dimming groups.

Figure 17:
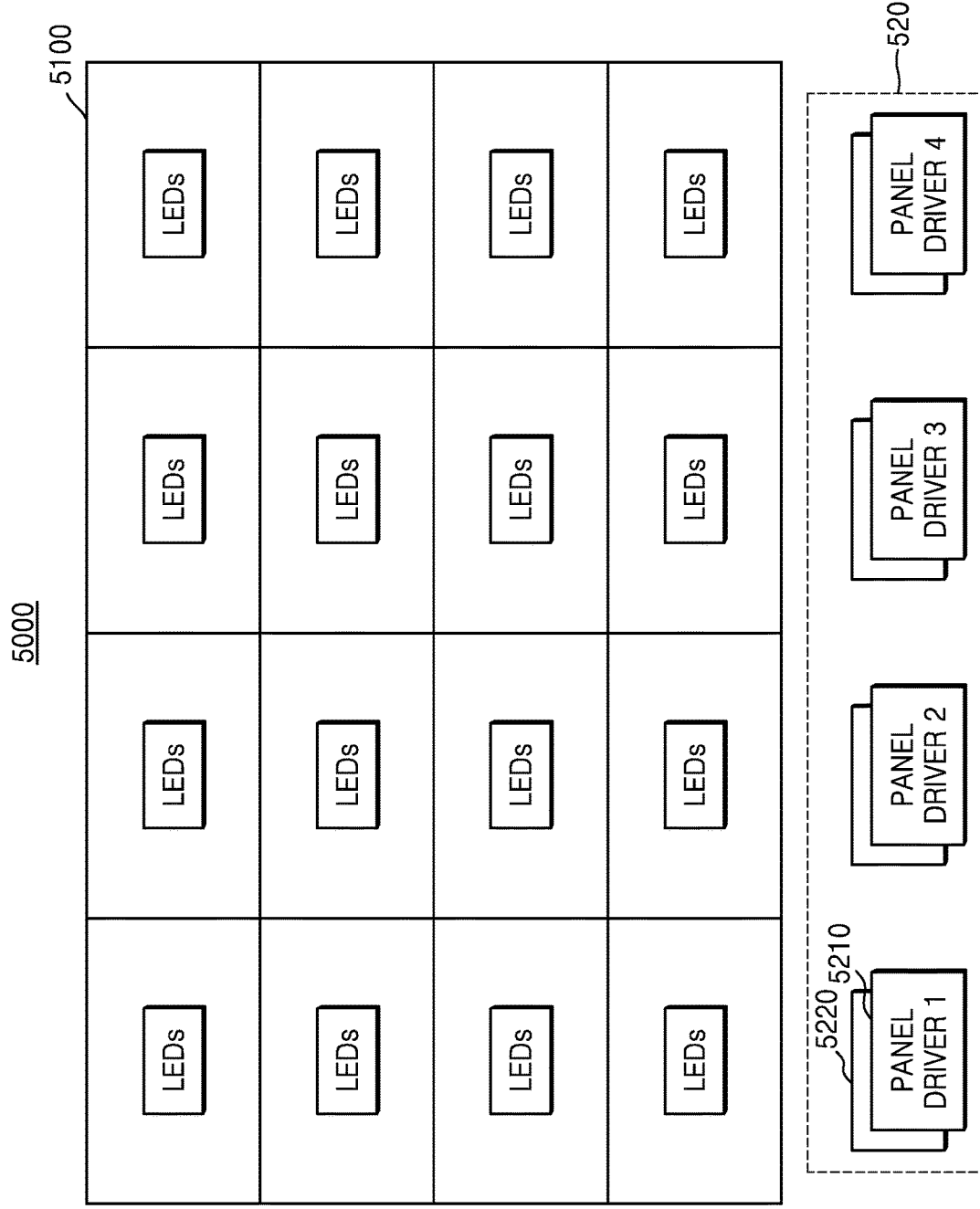
FIG. 17 is a diagram illustrating a backlight device according to an example embodiment.

FIG. 17 is a diagram illustrating a backlight device 5000 according to an example embodiment.

The backlight device 5000 may include backlight unit 5100 and backlight driver 5200. The backlight driver 5200 may drive a plurality of dimming groups of the backlight unit 5100 for each column. For example, the backlight driver 5200 may include a plurality of panel drivers 5210 and a plurality of pixel circuit groups 5220 corresponding to columns of the plurality of dimming groups of the backlight unit 5100. In some example embodiments, the backlight driver 5200 may be disposed on a non-display portion of the backlight unit 5100 and may drive LED elements through lines connected to the LED elements of the backlight unit 5100. The panel drivers 5210 and the pixel circuit groups 5220 may respectively correspond to the panel driver 100 and the pixel circuit group 200 of FIG. 3.

For example, referring to FIG. 17, the backlight unit 5100 may be divided into dimming groups of a 4×4 arrangement, and when the dimming groups are divided into 4 columns, the backlight driver 5200 may include 4 panel drivers 5210 and 4 pixel circuit groups 5220 corresponding to the number of columns. The 4 panel drivers 5210 and the 4 pixel circuit groups 5220 may be disposed in a non-display region adjacent to the corresponding column among the 4 columns.

Referring to FIG. 17, it is illustrated and described that the backlight driver 5200 includes the plurality of panel drivers 5210 and the plurality of pixel circuit groups 5220 corresponding to the columns of the plurality of dimming groups of the backlight unit 5100, but example embodiments are not limited thereto. For example, in order to drive the backlight driver 5200 for each row of the plurality of dimming groups of the backlight unit 5100, the backlight driver 5200 may include the plurality of panel drivers 5210 and the plurality of pixel circuit groups 5220 correspond to the rows.

Figure 18:
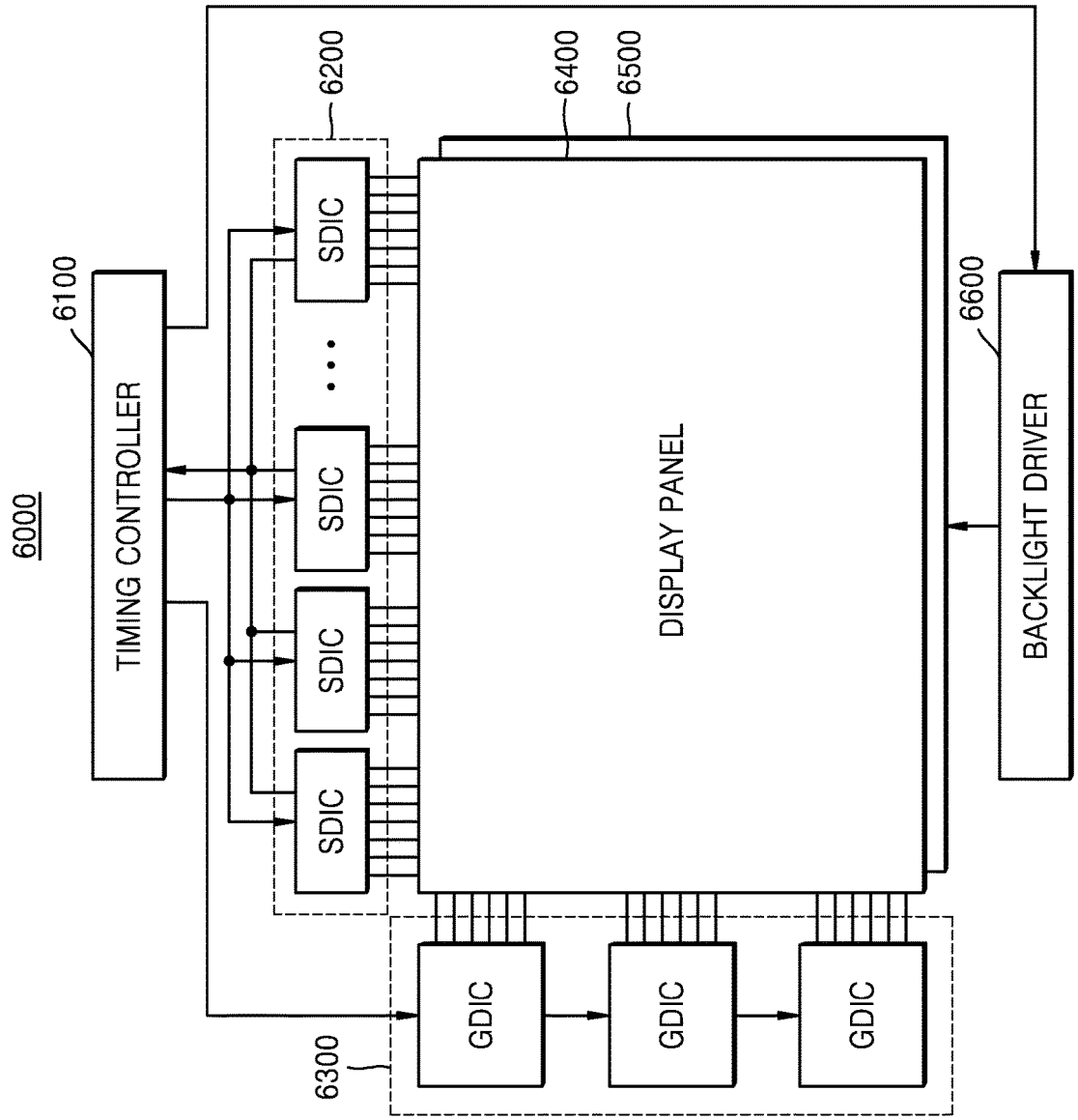
FIG. 18 is a diagram illustrating a display device according to an example embodiment.

FIG. 18 illustrates an example of a display device 6000 according to an example embodiment. The display device 6000 of FIG. 18 is a device including a medium-sized display panel 6400 and may be applied to, for example, a television and a monitor.

Referring to FIG. 18, the display device 6000 may include a timing controller 6100, a source driver 6200, a gate driver 6300, a display panel 6400, a backlight unit 6500, and a backlight driver 6600.

The timing controller 6100 may include one or more ICs or modules. The timing controller 6100 may communicate with a plurality of source driver ICs SDIC and a plurality of gate driver ICs GDIC through an interface.

The timing controller 6100 may generate control signals for controlling driving timing of the plurality of source driver ICs SDIC and the plurality of gate driver ICs GDIC, and provide the control signals to the plurality of source driver ICs SDIC and the plurality of gate driver ICs GDIC.

The source driver 6200 may include the plurality of source driver ICs SDIC, and the plurality of source driver ICs SDIC may be mounted on a circuit film such as a tape carrier package (TCP), a chip on film (COF), a flexible print circuit (FPC), etc., and attached to the display panel 6400 by using a tape automatic bonding (TAB) method or may be mounted on a non-display region of the display panel 6400 by using a chip on glass (COG) method.

The gate driver 6300 may include the plurality of gate driver ICs GDIC, and the plurality of gate driver ICs GDIC may be mounted on a circuit film and attached to the display panel 6400 by using the TAB method or may be mounted on the non-display region of the display panel 6400 by using the COG method. Alternatively, the gate driver 6300 may be directly formed on a lower substrate of the display panel 6400 by using a gate-driver in panel (GIP) method. The gate driver 6300 may be formed on a non-display region outside a pixel array of the display panel 6400 in which pixels are formed, and may be formed through the same TFT process as that of the pixels.

The backlight driver 6600 may correspond to one of the backlight drivers 1600, 2000, 3000, 4200, and 5200 described above with reference to FIGS. 1 to 17.

Figure 19:
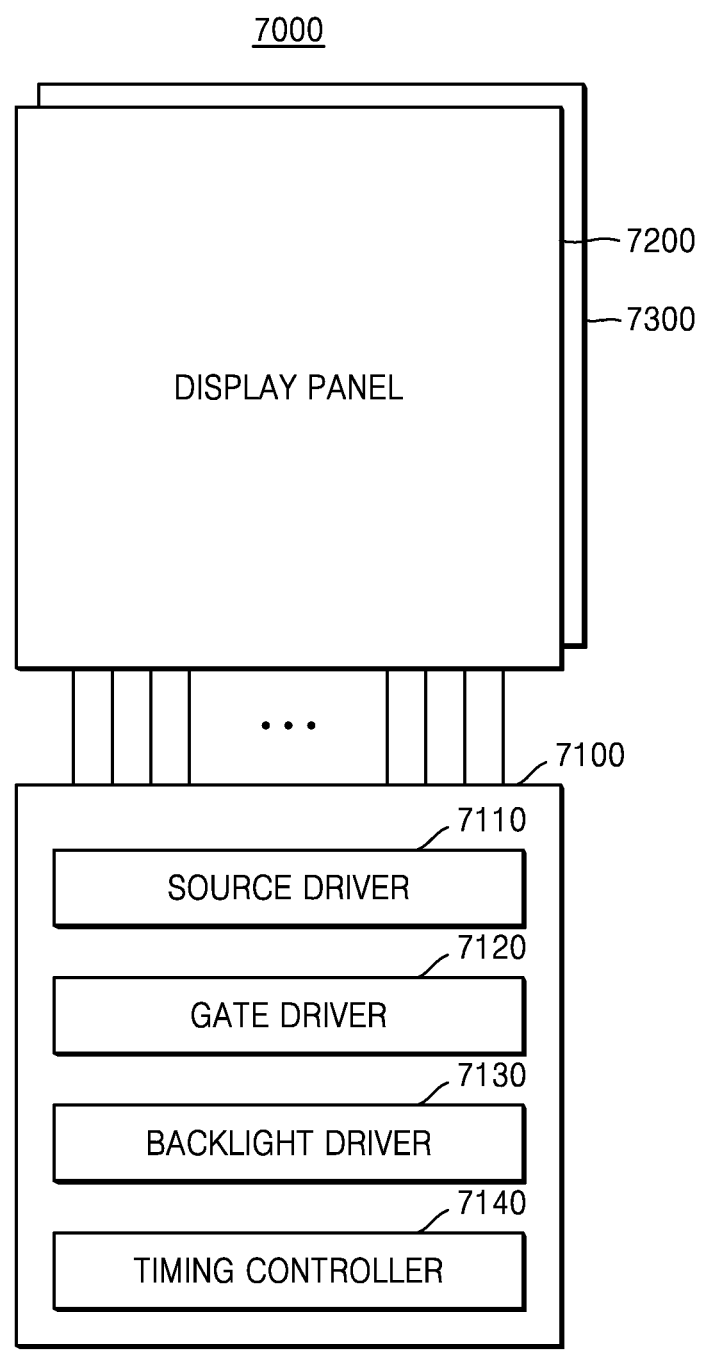
FIG. 19 is a diagram illustrating a display device according to an example embodiment.

FIG. 19 illustrates a display device 7000 according to an example embodiment. The display device 7000 of FIG. 19 is a device including a small display panel 7200 and may be applied to a mobile device or a wearable device such as a smartphone and a tablet PC.

Referring to FIG. 19, the display device 7000 may include a display driving circuit 7100, a display panel 7200, and a backlight unit 7300. The display driving circuit 7100 may include one or more ICs, may be mounted on a circuit film such as the TCP, the COF, the FPC, etc., and attached to the display panel 7200 by using the TAB method or may be mounted on the non-display region (e.g., a region where an image is not displayed) of the display panel 7200 by using the COG method.

The display driving circuit 7100 may include a source driver 7110, a gate driver 7120, a backlight driver 7130, and a timing controller 7140. The backlight driver 7130 may correspond to one of the backlight drivers 1600, 2000, 3000, 4200, and 5200 described above with reference to FIGS. 1 to 17.

While example embodiments have been shown and described, it will be understood that various changes in form and details may be made therein without departing from the spirit and scope of the following claims.

What is claimed is:

1. A backlight device comprising:
a plurality of light emitting diode (LED) elements divided into a plurality of dimming groups;
a panel driver configured to output a reference current for driving the plurality of LED elements; and
a plurality of pixel circuits, each of which is connected to the panel driver through a common line and is respectively configured to drive first LED elements comprised in a corresponding dimming group among the plurality of dimming groups,
wherein each of the plurality of pixel circuits is configured to:
in a first period of a frame period, obtain a reference voltage based on the reference current and store the reference voltage,
in a second period of the frame period, obtain luminance data of an image displayed by the corresponding dimming group, and
in a third period of the frame period, drive the first LED elements during a light emitting time corresponding to the luminance data obtained in the second period using the reference voltage stored in the first period.

2. The backlight device of claim 1, wherein the first period of the frame period comprises a plurality of sampling periods respectively corresponding to the plurality of pixel circuits, and
wherein each of the plurality of pixel circuits is configured to obtain the reference voltage and store the reference voltage in a corresponding sampling period among the plurality of sampling periods.

3. The backlight device of claim 2, wherein the panel driver comprises a current source configured to output the reference current in the first period of the frame period; and
a current writing controller configured to output a plurality of writing signals corresponding to the plurality of pixel circuits respectively indicating the plurality of sampling periods, and
wherein each of the plurality of pixel circuits is configured to obtain the reference voltage based on a corresponding writing signal among the plurality of writing signals.

4. The backlight device of claim 3, wherein each of the plurality of pixel circuits comprises a conversion circuit configured to obtain the reference voltage by converting the reference current into the reference voltage based on the corresponding writing signal;
a sample and hold circuit configured to store the reference voltage; and
LED drivers configured to respectively drive the first LED elements using the reference voltage stored by the sample and hold circuit.

5. The backlight device of claim 4, wherein the conversion circuit comprises a delay element configured to delay the corresponding writing signal, and
wherein the conversion circuit is configured to convert the reference current into the reference voltage based on a delayed writing signal provided by the conversion circuit.

6. The backlight device of claim 4, wherein the sample and hold circuit comprises a first sample and hold circuit; and a second sample and hold circuit, and
wherein the LED drivers comprise:
first LED drivers configured to drive LED elements of a first group among the first LED elements based on the reference voltage stored in the first sample and hold circuit; and
second LED drivers configured to drive LED elements of a second group among the first LED elements based on the reference voltage stored in the second sample and hold circuit.

7. The backlight device of claim 4, wherein each of the plurality of pixel circuits comprises a switching circuit comprising switches configured to connect the first LED elements to the LED drivers; and
a switching controller configured to obtain the luminance data and control the switching circuit to drive the switches in accordance with the light emitting time corresponding to the luminance data.

8. The backlight device of claim 7, wherein the luminance data comprises pulse width modulation (PWM) data having a width corresponding to a luminance, and
wherein the switching controller is configured to drive the first LED elements during the light emitting time corresponding to the width of the PWM data.

9. The backlight device of claim 1, wherein the panel driver comprises a current source controller configured to control a current source to change a magnitude of the reference current, and
wherein the current source controller is configured to select the magnitude of the reference current based on the luminance data and control the current source to output the reference current of the selected magnitude.

10. The backlight device of claim 1, wherein a portion of the first period overlaps with the second period.

11. The backlight device of claim 1, wherein a portion of the first period overlaps with the third period.

12. The backlight device of claim 1, wherein the plurality of pixel circuits are configured to:
for each of a preset number of frame periods, sequentially obtain the reference voltage based on the reference current and store the reference voltage in the first period, and
for every frame period, obtain the luminance data in the second period, and drive, in the third period, the first LED elements during the light emitting time corresponding to the luminance data obtained in the second period.

13. The backlight device of claim 12, wherein first pixel circuits among the plurality of pixel circuits are configured to, for each of the preset number of frame periods with respect to a first frame period, sequentially obtain the reference voltage based on the reference current and store the reference voltage in the first period, and
wherein second pixel circuits among the plurality of pixel circuits are configured to, for each of the preset number of frame periods based on a second frame period, sequentially obtain the reference voltage based on the reference current and store the reference voltage in the first period.

14. The backlight device of claim 1, wherein the plurality of pixel circuits are configured to, based on luminance data of a previous frame and a current frame having a common value, omit an operation of obtaining the luminance data in the second period.

15. A backlight driver configured to operate in units of a frame period comprising a charging period and a display period, the backlight driver comprising:

a first pixel circuit configured to drive first light emitting diode (LED) elements corresponding to a first region of a display panel;

a second pixel circuit configured to drive second LED elements corresponding to a second region of the display panel; and a panel driver comprising a current source connected in parallel with the first pixel circuit and the second pixel circuit, and configured to provide a reference current to the first pixel circuit and the second pixel circuit based on the current source, wherein the first pixel circuit is configured to:
  in a first sampling period of the charging period, obtain a reference voltage based on the reference current and store the reference voltage, and
  in the display period, drive the first LED elements based on first luminance data representing a luminance corresponding to the first region, and wherein the second pixel circuit is configured to:
  in a second sampling period of the charging period, obtain the reference voltage based on the reference current and store the reference voltage, and
  in the display period, drive the second LED elements based on second luminance data representing a luminance corresponding to the second region.

16. The backlight driver of claim 15, wherein the panel driver is configured to, output a first writing signal indicating the first sampling period and a second writing signal indicating the second sampling period, wherein the first pixel circuit is configured to obtain the reference voltage based on the reference current and store the reference voltage according to the first writing signal, and wherein the second pixel circuit is configured to obtain the reference voltage based on the reference current and store the reference voltage according to the second writing signal.

17. The backlight driver of claim 16, wherein each of the first luminance data and the second luminance data comprises pulse width modulation (PWM) data indicating a pulse width corresponding to a luminance, wherein the first pixel circuit is configured to drive the first LED elements during a first light emitting time corresponding to a first pulse width indicated by the first luminance data, and wherein the second pixel circuit is configured to drive the second LED elements during a second light emitting time corresponding to a second pulse width indicated by the second luminance data.

18. The backlight driver of claim 15, wherein the panel driver comprises a current source controller configured to control any one or any combination of a magnitude of the reference current and a pulse width of the reference current.

19. The backlight driver of claim 15, wherein the first pixel circuit and the second pixel circuit are configured to, for each of a preset number of frame periods in the display period, obtain the reference voltage based on the reference current and store the reference voltage.

20. A method of driving a backlight device for providing illumination to a display panel, the method comprising:
  generating a reference current using a current source in a first period of a frame period;
  in the first period, obtaining a reference voltage based on the reference current in a time division method using N (N is a positive integer) pixel circuits sharing the current source, and storing the reference voltage in each of the N pixel circuits;
  in a second period of the frame period, obtaining N luminance data respectively corresponding to N regions of an image displayed on the display panel; and
  in a third period of the frame period, driving LED elements during a light emitting time corresponding to the N luminance data using the reference voltage stored in the N pixel circuits.

* * * * *